US012707672B2

(12) United States Patent
Kinoshita

(10) Patent No.: US 12,707,672 B2
(45) Date of Patent: Aug. 11, 2026

(54) SILICON CARBIDE SEMICONDUCTOR DEVICE AND METHOD FOR PRODUCING SAME

(71) Applicant: FUJI ELECTRIC CO., LTD., Kawasaki (JP)

(72) Inventor: Akimasa Kinoshita, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 385 days.

(21) Appl. No.: 18/423,989

(22) Filed: Jan. 26, 2024

(65) Prior Publication Data

US 2024/0297248 A1 Sep. 5, 2024

(30) Foreign Application Priority Data

Mar. 3, 2023 (JP) ................................ 2023-033151

(51) Int. Cl.

| | |
|---|---|
| ***H10D 30/66*** | (2025.01) |
| ***H10D 12/01*** | (2025.01) |
| ***H10D 62/10*** | (2025.01) |
| ***H10D 62/832*** | (2025.01) |
| ***H10P 30/22*** | (2026.01) |

(52) U.S. Cl.

CPC ......... *H10D 30/665* (2025.01); *H10D 12/031* (2025.01); *H10D 30/668* (2025.01); *H10D 62/107* (2025.01); *H10D 62/109* (2025.01); *H10D 62/8325* (2025.01); *H10P 30/22* (2026.01)

(58) Field of Classification Search

CPC ......................... H10D 62/8325; H10D 30/668

See application file for complete search history.

(56) References Cited

U.S. PATENT DOCUMENTS

| | | | | |
|---|---|---|---|---|
| 2021/0005711 | A1* | 1/2021 | Martinez-Limia | H10D 30/66 |
| 2024/0387723 | A1* | 11/2024 | Takahashi | H10D 62/105 |
| 2025/0006799 | A1* | 1/2025 | Kawamura | H10D 62/82 |

FOREIGN PATENT DOCUMENTS

| | | | |
|---|---|---|---|
| JP | 2009-49198 | A | 3/2009 |
| WO | 2017/042963 | A1 | 3/2017 |

* cited by examiner

*Primary Examiner* — Benjamin P Sandvik

(57) ABSTRACT

A silicon carbide semiconductor device includes: a drift layer provided over an active portion and a breakdown voltage structure portion, the active portion has: a p-type base region provided in the drift layer; an n-type main region provided on the upper surface side of the base region; a p-type buried region provided in contact with the base region on the upper surface side of the drift layer; and a p-type base contact region provided in contact with the main region on the upper surface side of the buried region, the breakdown voltage structure portion has: p-type electric field relaxation regions containing SiC provided on the upper surface side of the drift layer, each of the main region and the base contact region containing SiC contains a 3C-structure in at least a part in contact with the main electrode, and the electric field relaxation regions are composed of a 4H-structure.

17 Claims, 15 Drawing Sheets

101
102
103
10a
10b
10c
91a
91b
92a
92b
9a (9)
9b (9)
8a
8b
81a
82a
81b
82b
6a
6b
6c
5a
5b
7a
7b
7c
n+
n−
p+
p
n 101
102
103
2
1
n−
n+

101
102
103
N
N
20
2
1
3
2
1
3
n
n
n−
n−
n+
n+

101
102
103
Al
Al
21
21
21
3
3
4
4
2
2
1
1
n
n
p+
p+
n−
n−
n+
n+

101
103
102
P
P
22
22
22
6c
n+
n+
6
n
n
3
3
4
p+
p+
4
n−
2
n−
2
1
n+
n+
1

101
102
103
Al
n+
p
n
p+
n−
6c
23
6
5
3
4
2
1

101
102
103
24
6c
n+
n−
n
p+
p
Al
82a
81a
8a
82b
81b
8b
6
5
4
3
2
1

101
102
103
25
6c
92a
91a
2
1
9a (9)
9b (9)
Al
p+
p
n+
n-
n
92b
8b
82b
81b
91b
4
3
8a
82a
81a
6
5

101
102
103
8a
82a
81a
6a
5a
4
3
2
1
82b
81b
8b
6b
5b
7c
7b
7a
92b
91b
4
3
6c
92a
91a
9a (9)
9a (9)
9a (9)
9b (9)
p+
n+
p
n
n−

101
102
103
26
6c
2
1
n+
n−
p+
p
n
Al
9b
92b
8b
82b
81b
91b
4
3
82a
81a
8a
6
5

101
103
102
27
Al
8a
82a
81a
6
5
4
3
2
1
p+
n+
p
n
n−
82b
81b
8b
92b
91b
6c
92a
91a
9b
9a (9)
9a (9)
9a (9)

101
102
103
Ar
29
6c
92a
91a
2
1
9a (9)
9b (9)
92b
8b
82b
81b
91b
4
3
8a
82a
81a
6
5a
n+
p+
p
n
n−

SILICON CARBIDE SEMICONDUCTOR DEVICE AND METHOD FOR PRODUCING SAME

CROSS-REFERENCE TO RELATED APPLICATION

This application claims benefit of priority under 35 USC 119 based on Japanese Patent Application No. 2023-033151 filed on Mar. 3, 2023, the entire contents of which are incorporated by reference herein.

BACKGROUND OF THE INVENTION

1. Field of the Invention

This disclosure relates to a silicon carbide (SiC) semiconductor device using silicon carbide (SiC) and a method for producing the same.

2. Description of the Related Art

JP 2009-49198 A discloses a semiconductor device in which an amorphous layer is formed by ion-implanting phosphorus into a hexagonal single-crystal silicon carbide substrate, heat treatment is performed to recrystallize the amorphous layer into cubic single-crystal n-type silicon carbide, and nickel is deposited on the upper surface of the n-type silicon carbide, forming an electrode.

WO 2017/042963 A1 discloses a semiconductor device having an $n^+$-type source region, and an $n^+$-type 3C-SiC region and a $p^+$-type potential fixing region formed in the $n^+$-type source region in an $n^-$-type epitaxially-grown layer formed on the first principal surface of an $n^+$-type SiC containing 4H-SiC, formed with a barrier metal film in contact with the $n^+$-type 3C-SiC region and the $p^+$-type potential fixing region, and formed with a source wiring electrode on the barrier metal film.

SUMMARY OF THE INVENTION

It has been examined to configure a source region (main region) with 3C-SiC to form ohmic-contact with a source electrode (main electrode) in a trench gate SiC semiconductor device. 3C-SiC has a band gap narrower than that of 4H-SiC, so that the breakdown voltage performance with respect to an electric field may become lower than that of 4H-SiC.

In view of the above-described problems, it is an object of this disclosure to provide a SiC semiconductor device allowing the main region to form ohmic-contact with the main electrode and capable of suppressing the lowering of the breakdown voltage performance of an electric field relaxation region in a breakdown voltage structure portion and a method for producing the same.

To achieve the above-described object, one aspect of this disclosure is a SiC semiconductor device including: an active portion; and a breakdown voltage structure portion provided surrounding the periphery of the active portion in plan view, in which a first conductivity-type drift layer containing silicon carbide is provided over the active portion and the breakdown voltage structure portion, the active portion has: a second conductivity-type base region containing silicon carbide provided on the upper surface side of the drift layer; a first conductivity-type main region containing silicon carbide provided on the upper surface side of the base region; a second conductivity-type buried region containing silicon carbide provided in contact with the base region on the upper surface side of the drift layer; a second conductivity-type base contact region containing silicon carbide provided in contact with the main region on the upper surface side of the buried region; a gate electrode provided with a gate insulating film interposed inside a trench passing through the main region and the base region; and a main electrode provided in contact with the main region and the base contact region, the breakdown voltage structure portion has: a second conductivity-type electric field relaxation region containing silicon carbide provided on the upper surface side of the drift layer; and an insulating film provided on the upper surface of the electric field relaxation region, the main region and the base contact region each contain a 3C-structure in at least a part in contact with the main electrode, and the electric field relaxation region is composed of a 4H-structure.

To achieve the above-described object, another aspect of this disclosure is a method for producing a SiC semiconductor device including: forming a first conductivity-type drift layer containing silicon carbide over an active portion and a breakdown voltage structure portion surrounding the periphery of the active portion in plan view; forming a second conductivity-type base region containing silicon carbide on the upper surface side of the drift layer in the active portion; forming a main region on the upper surface side of the base region, the main region being a first conductivity-type containing silicon carbide and containing a 3C-structure in at least the upper surface side part; forming a second conductivity-type buried region containing silicon carbide to be in contact with the base region on the upper surface side of the drift layer; forming a base contact region to be in contact with the main region on the upper surface side of the buried region, the base contact region being a second conductivity-type containing silicon carbide and containing a 3C-structure in at least the upper surface side part; forming a trench passing through the main region and the base region; forming a gate electrode with a gate insulating film interposed inside the trench; forming a main electrode to be in contact with the upper surfaces of the main region and the base contact region; forming an electric field relaxation region being a second conductivity-type containing silicon carbide and is composed of a 4H-structure, on the upper surface side of the drift layer in the breakdown voltage structure portion; and forming an insulating film on the upper surface of the electric field relaxation region.

DETAILED DESCRIPTION

Figure 1:
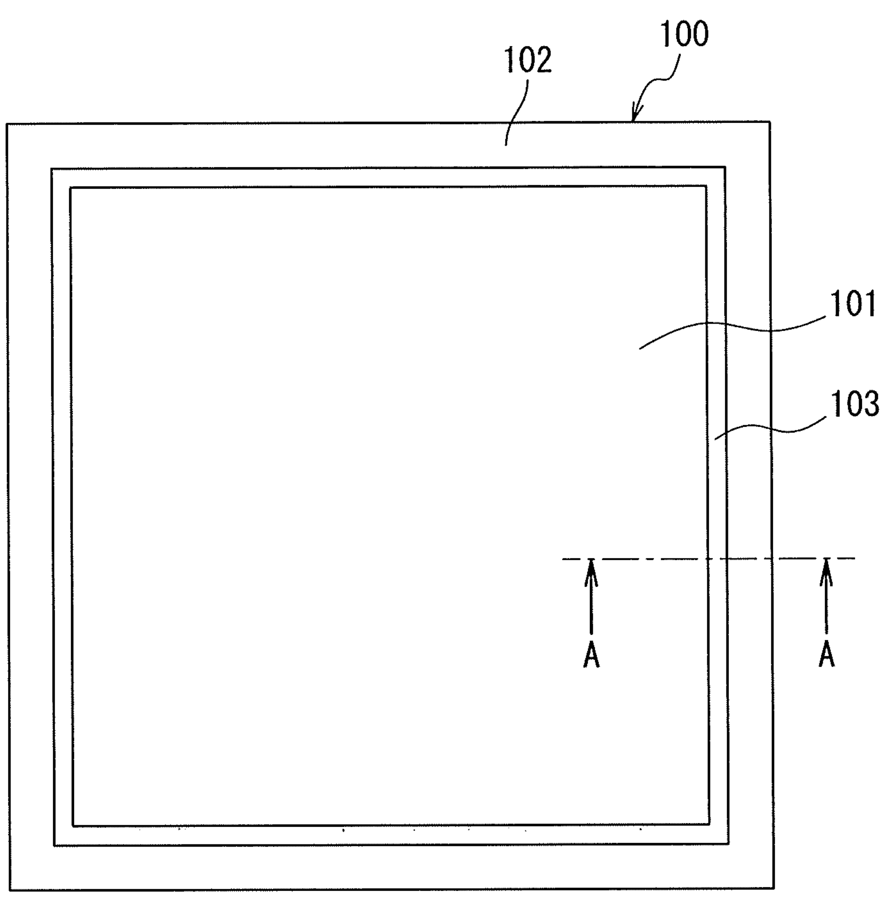
FIG. 1 is a plane schematic diagram illustrating an example of a SiC semiconductor device according to a first embodiment.

Hereinafter, first to third embodiments of this disclosure will be described with reference to the drawings. In the description of the drawings, the same or similar reference numerals are attached to the same or similar parts, and duplicate descriptions are omitted. The drawings are schematic, and the relationship between the thickness and the plane dimension, the thickness ratio of each layer, and the like are different from the actual relationship, ratio, and the like in some cases. Moreover, in some drawings, portions are illustrated with different dimensional relationships and proportions. The first to third embodiments described below exemplify devices or methods for embodying the technical idea of this disclosure. The span of the technical idea is not limited to materials, shapes, structures, and relative positions of elements described herein.

In this specification, a source region of a metal oxide semiconductor field-effect transistor (MOSFET) is "one main region (first main region)" selectable as an emitter region of an insulated-gate bipolar transistor (IGBT). In thyristors, such as MOS-controlled electrostatic induction thyristor (SI thyristor), the "one main region" is selectable as a cathode region. A drain region of the MOSFET is "the other main region (second main region)" of the semiconductor device and is selectable as a collector region in the IGBT and an anode region in the thyristor. When the "main region" is simply referred to in this specification, the "main region" means either the first main region or the second main region, whichever is reasonable from the common general knowledge of those skilled in the art.

The definitions of directions, such as the upper and the lower, in the following description are merely definitions for convenience of description and do not limit the technical idea of this disclosure. It is a matter of course that, when an object is rotated 90° and observed, the upper and the lower are converted to the right and the left in reading, and when the object is rotated 180° and observed, the upper and the lower are reversed in reading, for example. Further, the upper surface" may be read as a "front surface" and the "lower surface" may be read as a "back surface".

The following description illustrates a case where a first conductivity type is an n-type and a second conductivity type is a p-type. However, the conductivity type may be reversely selected, and the first conductivity type may be a p-type and the second conductivity type may be an n-type. "+" and "−" attached to "n" and "p" mean that semiconductor regions attached with "+" and "−" have impurity concentrations relatively higher or lower than those of semiconductor regions not attached with "+" and "−". However, it is not meant that, even in semiconductor regions attached with the same "n" and "n", the impurity concentrations of the semiconductor regions are exactly the same.

In addition, a crystal polymorphism is present in SiC crystals, and main examples include cubic 3C, hexagonal 4H, and hexagonal 6H. As the forbidden band gap at room temperature, a value of 2.23 eV for 3C-SiC, a value of 3.26 eV for 4H-SiC, and a value of 3.02 eV for 6H-SiC are reported. The following description illustrates a case where 4H-SiC and 3C-SiC are mainly used.

First Embodiment

<Structure of SiC Semiconductor Device>

As illustrated in FIG. 1, a SiC semiconductor device (semiconductor chip) 100 according to the first embodiment includes an active portion 101 having a rectangular planar shape and a breakdown voltage structure portion 102 provided surrounding the periphery of the active portion 101 in plan view, for example. The SiC semiconductor device 100 further includes a region 103 provided surrounding the active portion 101 between the active portion 101 and the breakdown voltage structure portion 102 in plan view.

Figure 2:
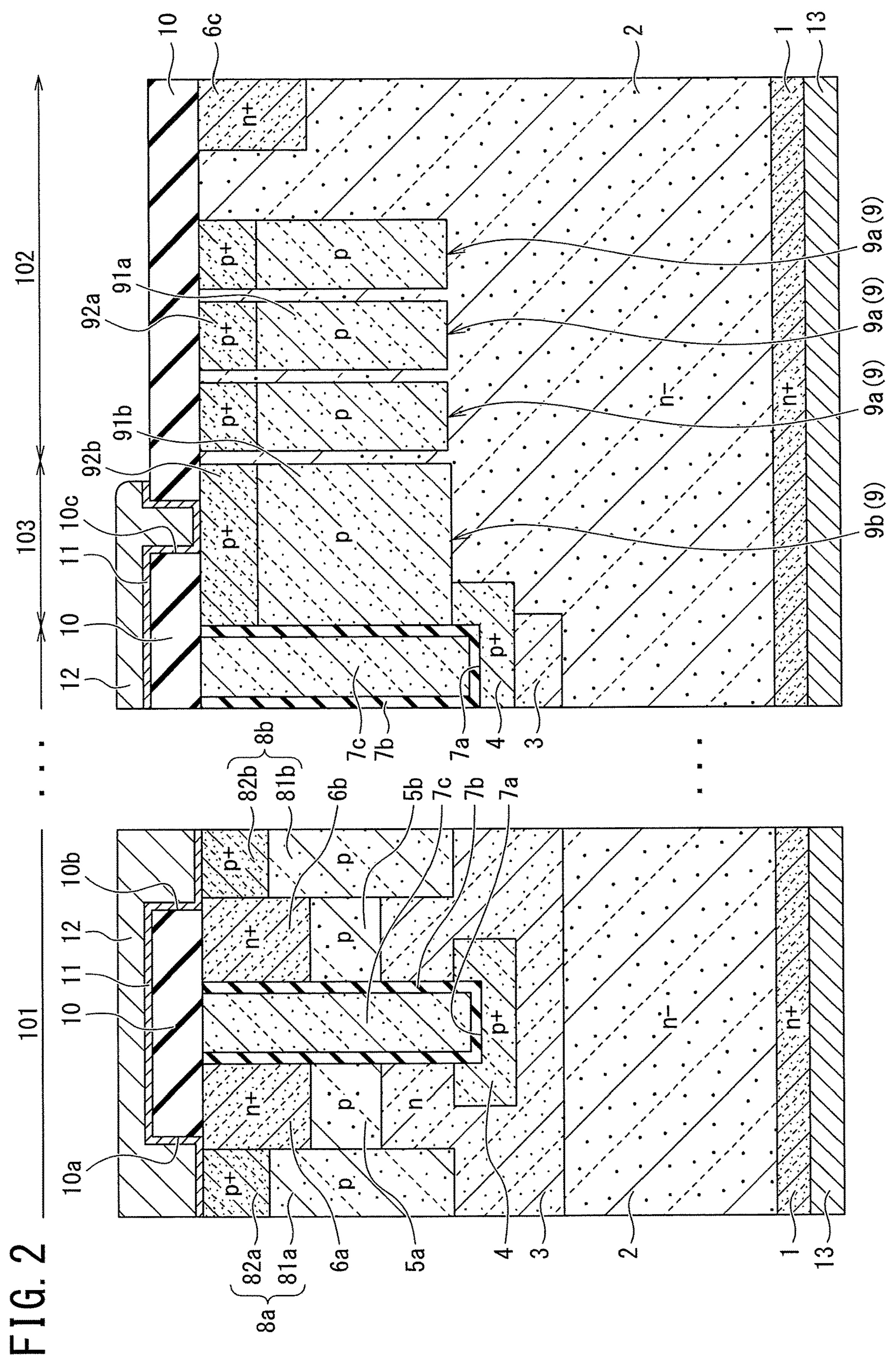
FIG. 2 is a longitudinal cross-sectional diagram illustrating the cross-sectional configuration as viewed in cross-section along the A-A cut line in FIG. 1.

FIG. 2 is a cross-sectional diagram as viewed from the direction indicated by the A-A line in FIG. 1. In FIG. 2, the illustration of a part of the active portion 101 is omitted. As illustrated in FIG. 2, a case is illustrated in which the active portion 101 contains an active element, the region 103 contains a ring region 9*b*, and the breakdown voltage structure portion 102 contains a plurality of electric field relaxation regions 9*a* described later as termination structures.

As illustrated in FIG. 2, a case illustrated in which the SiC semiconductor device 100 contains a trench-gate MOSFET as the active element. FIG. 2 illustrates one unit cell containing insulated gate electrode structures (7*b*, 7*c*) embedded in a trench 7*a*, but, in fact, a large number of the unit cells are periodically arranged.

The SiC semiconductor device 100 includes a first conductivity-type ($n^-$-type) drift layer 2 provided over the active portion 101, the breakdown voltage structure portion 102, and the region 103. The drift layer 2 contains an epitaxially-grown layer containing SiC, such as 4H-SiC, for example. The drift layer 2 has an impurity concentration in a range of about $1\times10^{15}$ $cm^{-3}$ or more and $5\times10^{16}$ $cm^{-3}$ or less, for example. The drift layer 2 has a thickness in a range of about 1 μm or more and 100 μm or less, for example. The impurity concentration and the thickness of the drift layer 2 can be adjusted as appropriate according to the breakdown voltage specification or the like.

Over the active portion 101 and the region 103, a first conductivity-type (n-type) current spreading layer (CSL) 3 having an impurity concentration higher than that of the drift layer 2 is selectively provided on the upper surface side of the drift layer 2. The lower surface of the current spreading layer 3 is in contact with the upper surface of the drift layer 2. The current spreading layer 3 is formed by ion implantation of N, for example. The current spreading layer 3 has an impurity concentration in a range of about $5\times10^{16}$ $cm^{-3}$ or more and $5\times10^{17}$ $cm^{-3}$ or less, for example. The current spreading layer 3 is not necessarily required to be provided. When the current spreading layer 3 is not provided, the drift layer 2 may be provided up to the region of the current spreading layer 3.

In the active portion 101, second conductivity-type (p-type) base regions 5*a*, 5*b* are selectively provided on the upper surface side of the current spreading layer 3. The lower surfaces of the base regions 5*a*, 5*b* are in contact with the upper surface of the current spreading layer 3. When the current spreading layer 3 is not provided, the lower surfaces of the base regions 5*a*, 5*b* are in contact with the upper surface of the drift layer 2. The base regions 5*a*, 5*b* are regions containing SiC, in which p-type impurities, such as aluminum, are ion-implanted into the current spreading layer 3, for example. The base regions 5*a*, 5*b* each may be constituted of an epitaxially-grown layer containing SiC, such as 4H-SiC. The base regions 5*a*, 5*b* have an impurity concentration in a range of about $1\times10^{16}$ $cm^{-3}$ or more and $1\times10^{18}$ $cm^{-3}$ or less, for example.

On the upper surface sides of the base regions 5*a*, 5*b*, first conductivity-type ($n^+$-type) first main regions (source regions) 6*a*, 6*b* having an impurity concentration higher than that of the drift layer 2 are selectively provided. The lower surface of the source region 6*a* is in contact with the upper surface of the base region 5*a*. The lower surface of the source region 6*b* is in contact with the upper surface of the base region 5*b*. The source regions 6*a*, 6*b* are regions containing SiC, in which n-type impurities are ion-implanted into the current spreading layer 3, for example. The source regions 6*a*, 6*b* have an impurity concentration in a range of about $1\times10^{19}$ $cm^{-3}$ or more and $3\times10^{21}$ $cm^{-3}$ or less, for example. The source regions 6*a*, 6*b* contain 3C-SiC and 4H-SiC. More specifically, the source regions 6*a*, 6*b* each contain a 3C-structure in at least upper surface side part. Hereinafter, 3C-SiC is sometimes referred to as a 3C-structure and 4H-SiC is sometimes referred to as a 4H-structure.

The source regions 6*a*, 6*b* have a dimension in the depth direction of 0.5 μm or less. The source regions 6*a*, 6*b* may have a dimension in the depth direction of 0.1 μm or more, for example. The proportion of 3C-SiC contained in a part from the upper surface to a depth of 0.3 μm of each of the source regions 6*a*, 6*b* is in a range of 50% or more and 100% or less.

The trench 7*a* is provided which passes through the respective source regions 6*a*, 6*b* and the respective base regions 5*a*, 5*b* from the upper surfaces of the source regions 6*a*, 6*b* in the normal direction with respect to the top surface of the respective source regions 6*a*, 6*b* (in the depth direction). The lower surface of the trench 7*a* reaches the current spreading layer 3. The width of the trench 7*a* is about 1 μm or less, for example. The source region 6*a* and the base region 5*a* are in contact with the left side surface of the trench 7*a*. The source region 6*b* and the base region 5*b* are in contact with the right side surface of the trench 7*a*. The trench 7*a* may have a planar pattern extending in a stripe state in the backside direction and in the front direction in the sheet of FIG. 2, or may have a dot-like planar pattern.

The gate insulating film 7*b* is provided along the lower surface and the side surfaces on both sides of the trench 7*a*. The gate electrode 7*c* is provided inside the trench 7*a* with the gate insulating film 7*b* interposed. The gate insulating film 7*b* and the gate electrode 7*c* implement a trench-gate insulated gate electrode structure (7*b*, 7*c*).

Usable as the gate insulating film 7*b* is a single layer film containing any one film, a composite film obtained by stacking two or more films, or the like of not only a silicon oxide film ($SiO_2$ film) but a silicon oxynitride (SiON) film, a strontium oxide (SrO) film, a silicon nitride ($Si_3N_4$) film, an aluminum oxide ($Al_2O_3$) film, a magnesium oxide film (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film. As a material of the gate electrode 7*c*, a polysilicon layer doped with p-type impurity impurities or n-type impurities with a high impurity concentration (doped polysilicon layer), or high melting point metal, such as titanium (Ti), tungsten (W), or nickel (Ni) is usable, for example.

A gate bottom protection region 4 of the second conductivity-type ($p^+$-type) is provided at the bottom of the trench 7*a* inside the current spreading layer 3. The upper surface of the gate bottom protection region 4 is in contact with the lower surface of the trench 7*a*. The upper surface of the gate bottom protection region 4 does not have to be in contact with the lower surface of the trench 7*a*. The gate bottom protection region 4 has an impurity concentration in a range of about $1\times10^{17}$ $cm^{-3}$ or more and $1\times10^{19}$ $cm^{-3}$ or less, for example. The gate bottom protection region 4 is a region containing SiC, in which p-type impurities are ion-implanted into the current spreading layer 3, for example. The gate bottom protection region 4 is electrically connected to a source wiring electrode 12 in a part, the illustration of which is omitted, and has a function of relaxing an electric field applied to the lower surface of the trench 7*a* by being depleted when the MOSFET is turned off.

On the upper surface side of the current spreading layer 3, second conductivity-type (p-type) buried regions 81*a*, 81*b* are selectively provided in contact with the base regions 5*a*, 5*b*, respectively. The lower surfaces of the buried regions 81*a*, 81*b* are in contact with the current spreading layer 3. The side surface of the buried region 81*a* is in contact with the current spreading layer 3 and the base region 5*a*. The side surface of the buried region 81*b* is in contact with the current spreading layer 3 and the base region 5*b*. The buried regions 81*a*, 81*b* are regions containing SiC, in which p-type impurities are ion-implanted into the current spreading layer 3, for example. The buried regions 81*a*, 81*b* have an impurity concentration in a range of about $5\times10^{17}$ $cm^{-3}$ or more and $1\times10^{19}$ $cm^{-3}$ or less, for example. The buried regions 81*a*, 81*b* are constituted of 4H-SiC.

On the upper surface sides of the buried regions 81*a*, 81*b*, $p^+$-type base contact regions 82*a*, 82*b* are selectively provided respectively, the base contact regions 82*a*, 82*b* having an impurity concentration higher than that of the buried region 81*a* are selectively provided. The lower surface of the base contact region 82*a* is in contact with the upper surface of the buried region 81*a*. The side surface of the base contact region 82*a* is in contact with the source region 6*a*. The lower surface of the base contact region 82*b* is in contact with the upper surface of the buried region 81*b*. The side surface of the base contact region 82*b* is in contact with the source region 6*b*. The base contact regions 82*a*, 82*b* are regions containing SiC, in which p-type impurities are ion-implanted into the current spreading layer 3, for example. The impurity concentration of the base contact region 82*a*, 82*b* is higher than that of the buried regions 81*a*, 81*b* and is in a range of about $1\times10^{20}$ $cm^{-3}$ or more and $3\times10^{21}$ $cm^{-3}$ or less, for example. The base contact regions 82*a*, 82*b* contain 3C-SiC and 4H-SiC. More specifically, the base contact regions 82*a*, 82*b* each contain the 3C-structure in at least upper surface side part.

The base contact regions 82*a*, 82*b* have a dimension in the depth direction of 0.5 μm or less. Further, the base contact regions 82*a*, 82*b* may have a dimension in the depth direction of 0.1 μm or more, for example. The proportion of 3C-SiC contained in a part from the upper surface to a depth of 0.3 μm of each of the base contact regions 82*a*, 82*b* is in a range of 50% or more and 100% or less.

In the breakdown voltage structure portion 102, the plurality of second conductivity-type (p-type) electric field relaxation regions 9*a* is selectively provided on the upper surface side of the drift layer 2. In the example illustrated in FIG. 2, three electric field relaxation regions 9*a* are provided on the upper surface side of the drift layer 2. The electric field relaxation regions 9*a* are concentric guard rings (field limiting rings) in plan view, the illustration of which is omitted. The electric field relaxation regions 9*a* are separated from each other by the drift layer 2. The lower surfaces of the electric field relaxation regions 9*a* are in contact with the upper surface of the drift layer 2. The electric field relaxation regions 9*a* are regions containing SiC, in which p-type impurities, such as aluminum, are ion-implanted into the drift layer 2, for example. More specifically, the electric field relaxation regions 9*a* are regions composed of 4H-SiC. 4H-SiC has a bandgap wider than that of 3C-SiC and has breakdown voltage performance with respect to an electric field higher than that of 3C-SiC. Further, 4H-SiC has crystal defects fewer than those of 3C-SiC.

The electric field relaxation regions 9*a* each have a p-type first part 91*a* and a $p^+$-type second part 92*a*. The second part 92*a* is located at a position in the depth direction shallower than the position of the first part 91*a*. The lower surfaces of the second parts 92*a* are in contact with the upper surfaces of the first parts 91*a*. The impurity concentration of the second parts 92*a* is about $2\times10^{18}$ $cm^{-3}$ or more, for example, and is set higher than the impurity concentration of the first parts 91*a*. By setting the impurity concentration of the first parts 91*a*, which are located at deeper positions than the positions of the second parts 92*a*, lower than the impurity concentration of the second parts 92*a*, the breakdown voltage performance with respect to an electric field of the electric field relaxation regions 9*a* is improved.

In the breakdown voltage structure portion 102, a first conductivity-type ($n^+$-type) channel stopper region 6*c* is provided in the outermost periphery of the upper surface side of the drift layer 2. The lower surface of the channel stopper region 6*c* is in contact with the upper surface of the drift layer 2. The channel stopper region 6*c* is a region containing 3C-SiC, in which n-type impurities are ion-implanted into the drift layer 2, for example.

In the region 103, a second conductivity-type (p-type) ring region 9*b* is selectively provided on the upper surface side of the drift layer 2. The lower surface of the ring region 9*b* is in contact with the upper surface of the drift layer 2. The ring region 9*b* is a region containing SiC, in which p-type impurities are ion-implanted into the drift layer 2, for example. More specifically, the ring region 9*b* is a region composed of 4H-SiC. The ring region 9*b* is a ring-shaped part surrounding an edge portion of the active portion 101 in plan view, the illustration of which is omitted.

The ring region 9*b* has a first part 91*b* and a second part 92*b*. The second part 92*b* is located at a position in the depth direction shallower than the position of the first part 91*b*. The lower surface of the second part 92*b* is in contact with the upper surface of the first part 91*b*. The ring region 9*b* has substantially the same impurity concentration as the impurity concentration of the electric field relaxation regions 9*a*. The impurity concentration of the second part 92*b* is about $2\times10^{18}$ $cm^{-3}$ or more, for example, and is set higher than the impurity concentration of the first part 91*b*.

On the upper surface side of the gate electrode 7*c*, the upper surface side of the region 103, and the upper surface side of the breakdown voltage structure portion 102, an insulating film 10 is selectively provided. In the breakdown voltage structure portion 102, the insulating film 10 is provided on the upper surfaces of the electric field relaxation regions 9*a*. More specifically, the insulating film 10 is provided at a position where the insulating film 10 covers the second parts 92*a* of the electric field relaxation regions 9*a*. The insulating film 10 is constituted of a single layer film, such as a silicon oxide film doped with boron (B) and phosphorus (P) (BPSG film), a silicon oxide film doped with phosphorus (P) (PSG film), a non-doped silicon oxide film free from phosphorus (P) or boron (B), referred to as "NSG", a silicon oxide film doped with boron (B) (BSG film), and a silicon nitride film ($Si_3N_4$ film), or a stacked-layer film thereof, for example. The insulating film 10 is provided with contact holes 10*a*, 10*b* to expose the upper surfaces of the source regions 6*a*, 6*b* and the base contact regions 82*a*, 82*b*. Further, the insulating film 10 is provided with a contact hole 10*c* to expose the upper surface of the ring region 9*b*, i.e., the upper surface of the second part 92*b*.

First main electrodes (source electrodes) (11, 12) are provided to cover the insulating film 10, the upper surfaces of the source regions 6*a*, 6*b* and the base contact regions 82*a*, 82*b* exposed from the contact holes 10*a*, 10*b*, respectively, and the upper surface of the ring region 9*b* exposed from the contact hole 10*c*. The source electrodes (11, 12) include the lower-layer barrier metal layer 11 and the upper-layer source wiring electrode 12. For example, the barrier metal layer 11 is constituted of metal, such as titanium nitride (TiN), titanium (Ti), or a TiN/Ti stacked structure with Ti as a lower layer. The barrier metal layer 11 is in direct contact with the source regions 6*a*, 6*b* and the base contact regions 82*a*, 82*b*, and is in ohmic-contact with the source regions 6*a*, 6*b* and the base contact regions 82*a*, 82*b* with low resistance. The barrier metal layer 11 is in direct contact with the second part 92*b* of the ring region 9*b*. The upper surfaces of the second parts 92*a* are covered with the insulating film 10, and therefore the electric field relaxation regions 9*a* are not in contact with the barrier metal layer 11 and are in an electrically floating state. The electric field relaxation regions 9*a* are configured to be free from 3C-SiC because the electric field relaxation regions 9*a* are not expected to form ohmic-contact with other members with low resistance, and because a deterioration of breakdown voltage properties is to be suppressed.

The source wiring electrode 12 is electrically connected to the source regions 6*a*, 6*b*, the base contact regions 82*a*, 82*b*, and the ring region 9*b* through the barrier metal layer 11 interposed. The source wiring electrode 12 is provided separately from a gate wiring electrode (illustration of which is omitted) electrically connected to the gate electrode 7*c*. The source wiring electrode 12 is constituted of metal, such as aluminum (Al), aluminum-silicon (Al—Si), aluminum-copper (Al—Cu), or copper (Cu).

On the lower surface side of the drift layer 2, a first conductivity-type ($n^+$-type) second main region (drain region) 1 having an impurity concentration higher than that of the drift layer 2 is provided. The drain region 1 is constituted of a semiconductor substrate (SiC substrate) containing 4H-SiC, for example. The drain region 1 has an impurity concentration in a range of about $1\times10^{18}$ $cm^{-3}$ or more and $3\times10^{20}$ $cm^{-3}$ or less, for example. The drain region 1 has a thickness in a range of about 30 μm or more and 500 μm or less, for example. Between the drift layer 2 and the drain region 1, a dislocation conversion layer or a recombination promotion layer may be provided, which is an n-type buffer layer having an impurity concentration higher than that of the drift layer 2 and an impurity concentration lower than that of the drain region 1.

On the lower surface side of the drain region 1, a second main electrode (drain electrode) 13 is provided. As the drain electrode 13, a single layer film containing gold (Au) or a metal film in which titanium (Ti), nickel (Ni), and Au are stacked in this order from the drain region 1 side is usable, and further a metal film of molybdenum (Mo), tungsten (W), or the like may be stacked on the lowest layer, for example. Further, a drain contact layer, such as a nickel silicide ($NiSi_x$) film, for ohmic-contact may be provided between the drain region 1 and the drain electrode 13.

The SiC semiconductor device according to the first embodiment during the operation applies a positive voltage to the drain electrode 13 while using the source electrode (11, 12) as a ground potential, and causes an inversion layer (a channel) to be formed in the respective base regions 5*a* and 5*b* toward the side surfaces of the trench 7*a* so as to be in the ON-state when a positive voltage of a threshold or greater is applied to the gate electrode 7*c*. In the ON-state, a current flows from the drain electrode 13 toward the source electrode (11, 12) through the drain region 1, the drift layer 2, the current spreading layer 3, the inversion layers of the base regions 5*a* and 5*b*, and the source regions 6*a* and 6*b*. When the voltage applied to the gate electrode 7*c* is smaller than the threshold, the SiC semiconductor device is led to be the OFF-state since no inversion channel is formed in the base region 5*a* or 5*b*, and no current flows from the drain electrode 13 toward the source electrode (11, 12).

According to the SiC semiconductor device of the first embodiment, at least a part in contact with the source electrodes (11, 12) of each of the source regions 6*a*, 6*b* and the base contact regions 82*a*, 82*b* is constituted of 3C-SiC, while the electric field relaxation regions 9*a* are composed of 4H-SiC having a band gap wider than that of 3C-SiC. This can suppress the lowering of the breakdown voltage performance with respect to an electric field of the breakdown voltage structure portion 102.

Further, the electric field relaxation regions 9*a* are composed of 4H-SiC having crystal defects fewer than those of 3C-SiC, and therefore an increase in irregularities of the upper surfaces of the second parts 92*a* is suppressed. This suppresses an increase in defects generating in the interface between the upper surfaces of the second parts 92*a* and the insulating film 10. This can suppress the lowering of the reliability of the breakdown voltage structure portion 102.

In each of the source regions 6*a*, 6*b* and the base contact regions 82*a*, 82*b*, at least a part in contact with the source electrodes (11, 12) contains 3C-SiC. Therefore, the source regions 6*a*, 6*b* and the base contact regions 82*a*, 82*b* can ohmic-contact the source electrodes (11, 12) with low resistance without forming a silicide layer of nickel (Ni) silicide or the like. Thus, problems, such as peeling of the silicide layer, can be suppressed as compared with a case where the silicide layer is formed.

<Method for Producing SiC Semiconductor Device>

Next, an example of a method for producing a SiC semiconductor device according to the first embodiment will be described. It is a matter of course that the method for producing a SiC semiconductor device described below is an example, and the production can be realized by various other production methods, including modifications of the method, within the meaning of claims.

Figure 3:
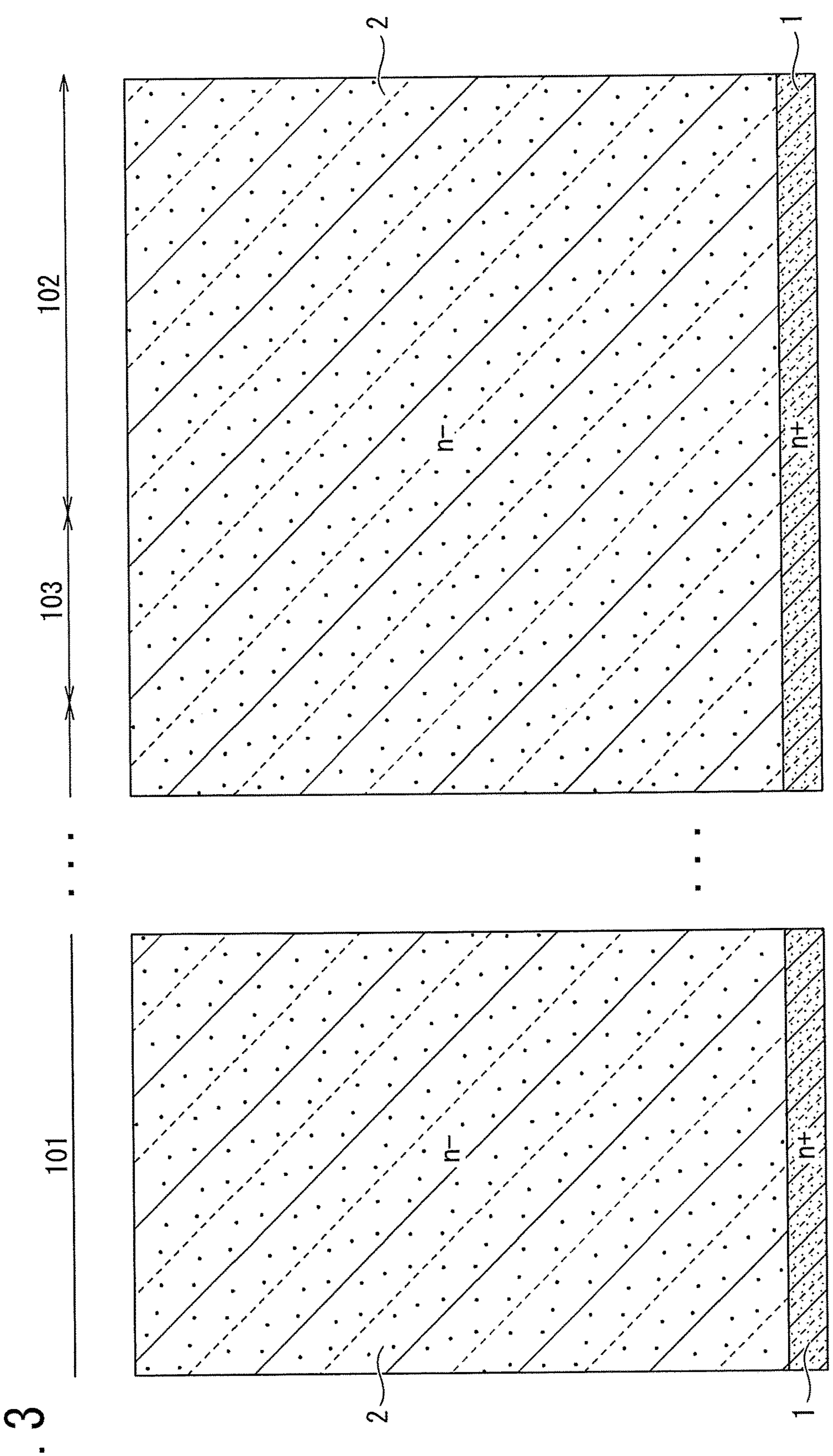
FIG. 3 is a cross-sectional schematic diagram for explaining one example of a method for producing a SiC semiconductor device according to the first embodiment.

First, a semiconductor substrate (SiC substrate) 1 containing $n^+$-type 4H-SiC doped with n-type impurities, such as nitrogen (N), is prepared as illustrated in FIG. 3. The upper surface of the SiC substrate 1 has an off angle of 3° to 8° from the {0001} plane, for example. Then, the drift layer 2 containing $n^-$-type 4H-SiC having an impurity concentration lower than that of the SiC substrate 1 is epitaxially grown on the upper surface of the SiC substrate 1, being doped with n-type impurities, such as N.

Figure 4:
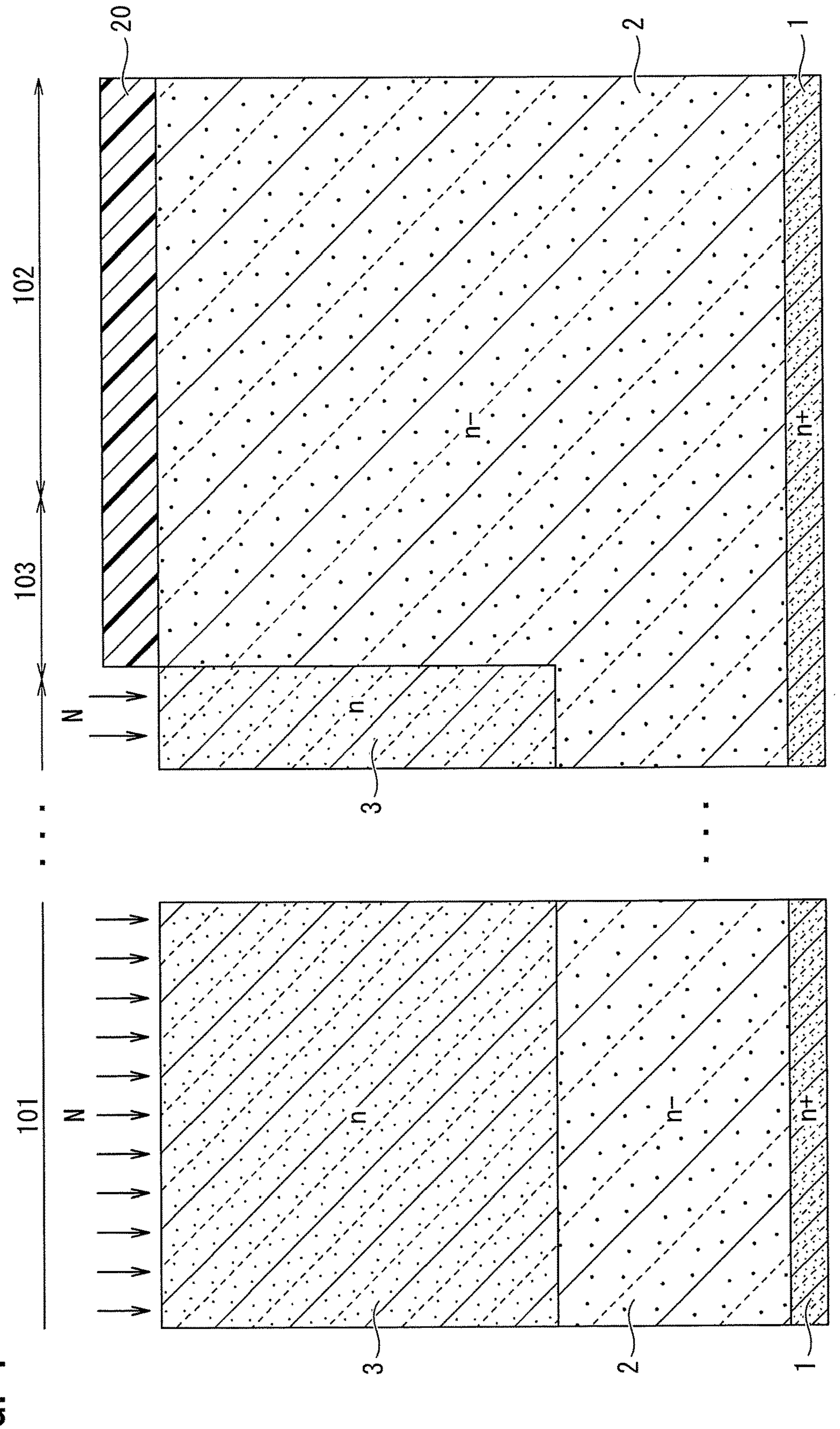
FIG. 4 is a cross-sectional schematic diagram following FIG. 3 for explaining the one example of the method for producing a SiC semiconductor device according to the first embodiment.

Next, a mask pattern 20 containing a photoresist film is formed on the upper surface of the drift layer 2 using a photolithography technology as illustrated in FIG. 4. Then, n-type impurities, such as nitrogen (N), are ion-implanted into an upper portion of the drift layer 2 using the mask pattern 20 as an ion implantation mask, thereby forming the n-type current spreading layer 3 containing 4H-SiC. Thereafter, the mask pattern 20 is removed. The mask pattern 20 may be a hard mask pattern containing an oxide film, for example.

Figure 5:
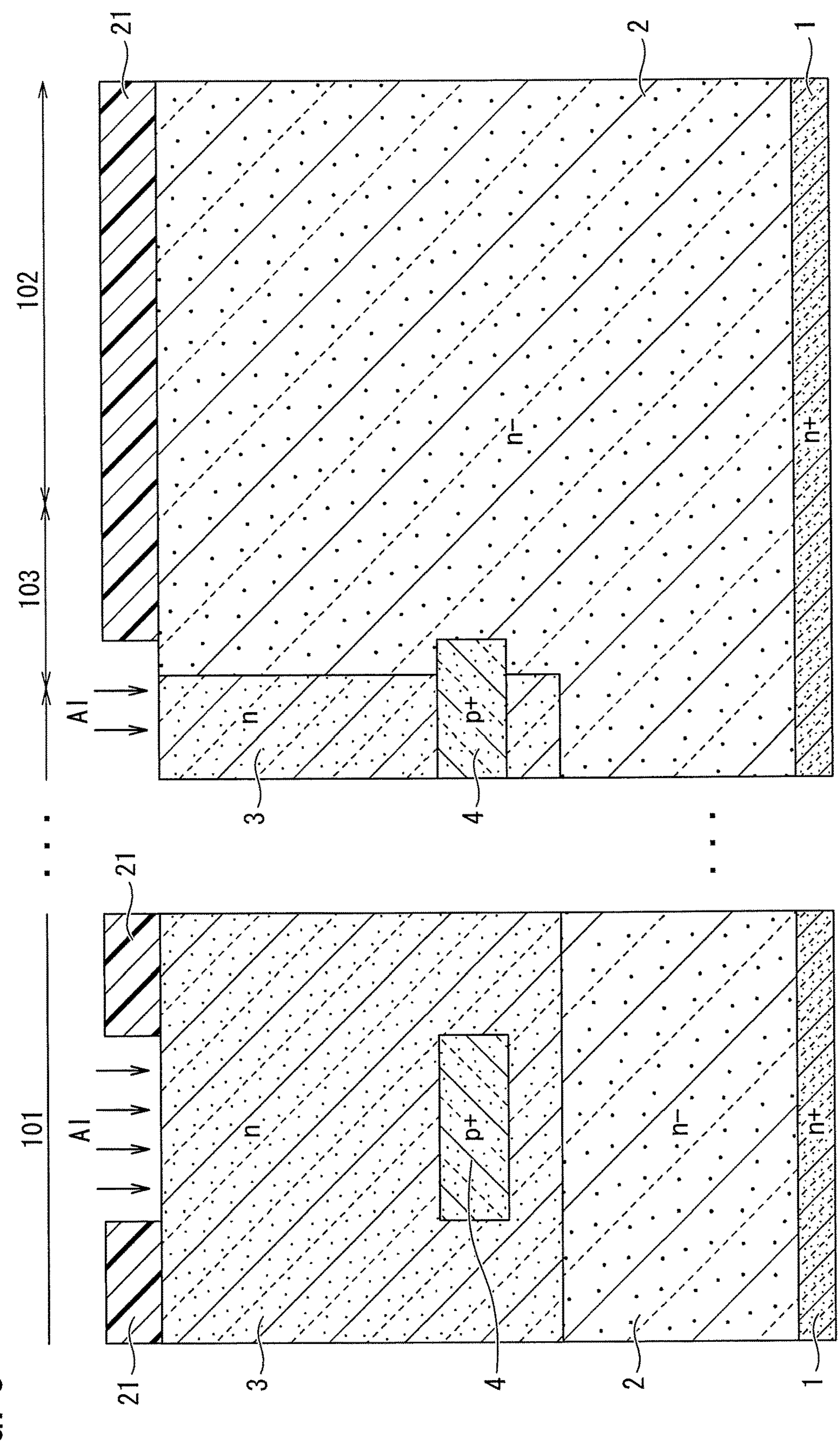
FIG. 5 is a cross-sectional schematic diagram following FIG. 4 for explaining the one example of the method for producing a SiC semiconductor device according to the first embodiment.

Next, a mask pattern 21 containing a photoresist film is formed on the upper surface of the drift layer 2 as illustrated in FIG. 5. Then, p-type impurities, such as aluminum (Al), are selectively ion-implanted using the mask pattern 21 as an ion implantation mask, thereby selectively forming the gate bottom protection region 4. The ion implantation of aluminum in this case is the implantation into a deeper region, and therefore is performed at a higher acceleration energy in a range of 780 keV or more and 960 keV or less, for example. Thereafter, the mask pattern 21 is removed.

Figure 6:
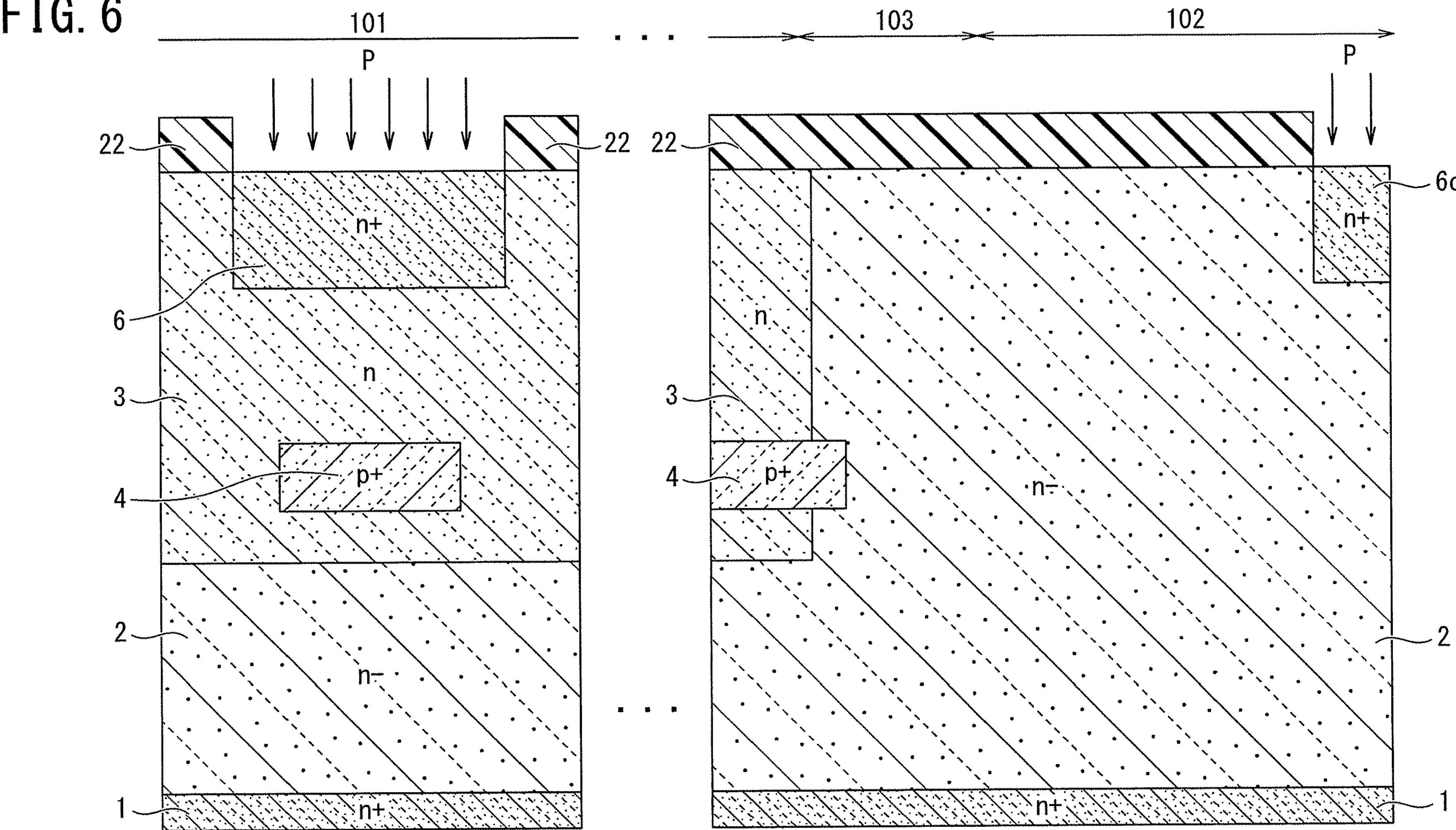
FIG. 6 is a cross-sectional schematic diagram following FIG. 5 for explaining the one example of the method for producing a SiC semiconductor device according to the first embodiment.

Next, a mask pattern 22 containing a photoresist film is formed on the upper surface of the drift layer 2 as illustrated in FIG. 6. Then, n-type impurities, such as phosphorus (P) or nitrogen (N), are selectively ion-implanted using the mask pattern 22 as an ion implantation mask. As a result, the $n^+$-type source region 6 is selectively formed on the upper surface side of the drift layer 2, and the $n^+$-type channel stopper region 6*c* is formed on the upper surface side of the drift layer 2 in the breakdown voltage structure portion 102. In the ion implantation of the source region 6 and the channel stopper region 6*c*, the 4H-SiC structure on the upper surface side of the source region 6 is broken, forming an amorphous structure. The temperature in the ion implantation is set low to break the 4H-SiC structure. By performing the ion implantation of high-concentration impurities at a low temperature, the 4H-SiC structure can be broken. The temperature in the ion implantation is set to about 20° C. or more and less than 300° C., for example. The temperature boundary at which the 4H-SiC structure can be broken is around 300° C., and therefore the temperature in the ion implantation may be set to 200° C. or less, for example. The dose amount in the ion implantation is set to be about $2\times10^{15}$ $cm^{-2}$ or more, for example. Thereafter, the mask pattern 22 is removed. The mask pattern 22 may be a hard mask pattern containing an oxide film, for example.

Figure 7:
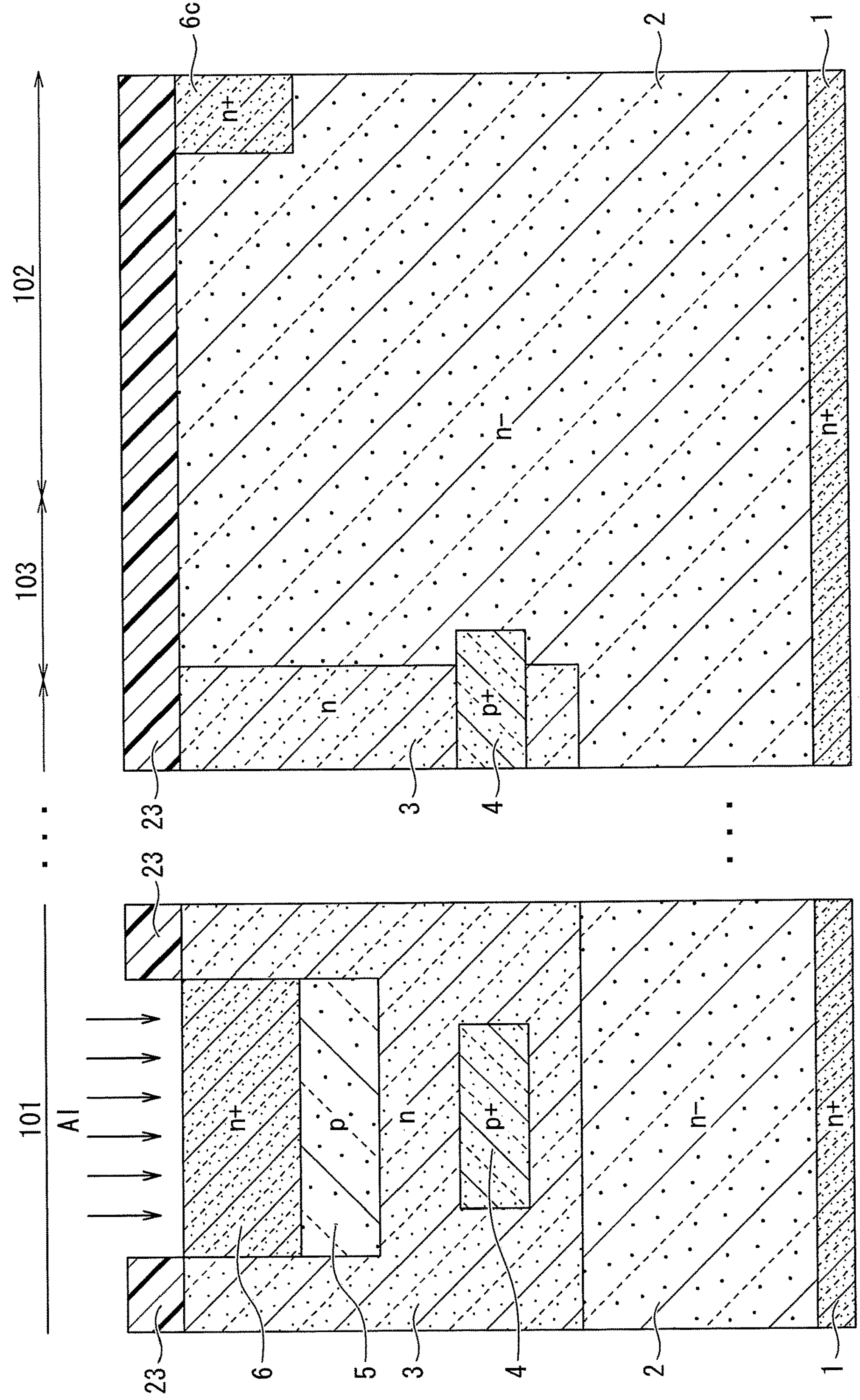
FIG. 7 is a cross-sectional schematic diagram following FIG. 6 for explaining the one example of the method for producing a SiC semiconductor device according to the first embodiment.

Next, a mask pattern 23 containing a photoresist film is formed on the upper surface of the drift layer 2 as illustrated in FIG. 7. Then, p-type impurities, such as aluminum (Al), are selectively ion-implanted using the mask pattern 23 as an ion implantation mask. As a result, the base region 5 is selectively formed on the upper surface side of the current spreading layer 3 and on the lower surface side of the source region 6 in the active portion 101 as illustrated in FIG. 7. The base region 5 is a region having the lowest impurity concentration among regions formed of p-type impurities. Thereafter, the mask pattern 23 is removed. The mask pattern 23 may be a hard mask pattern containing an oxide film, for example.

Figure 8:
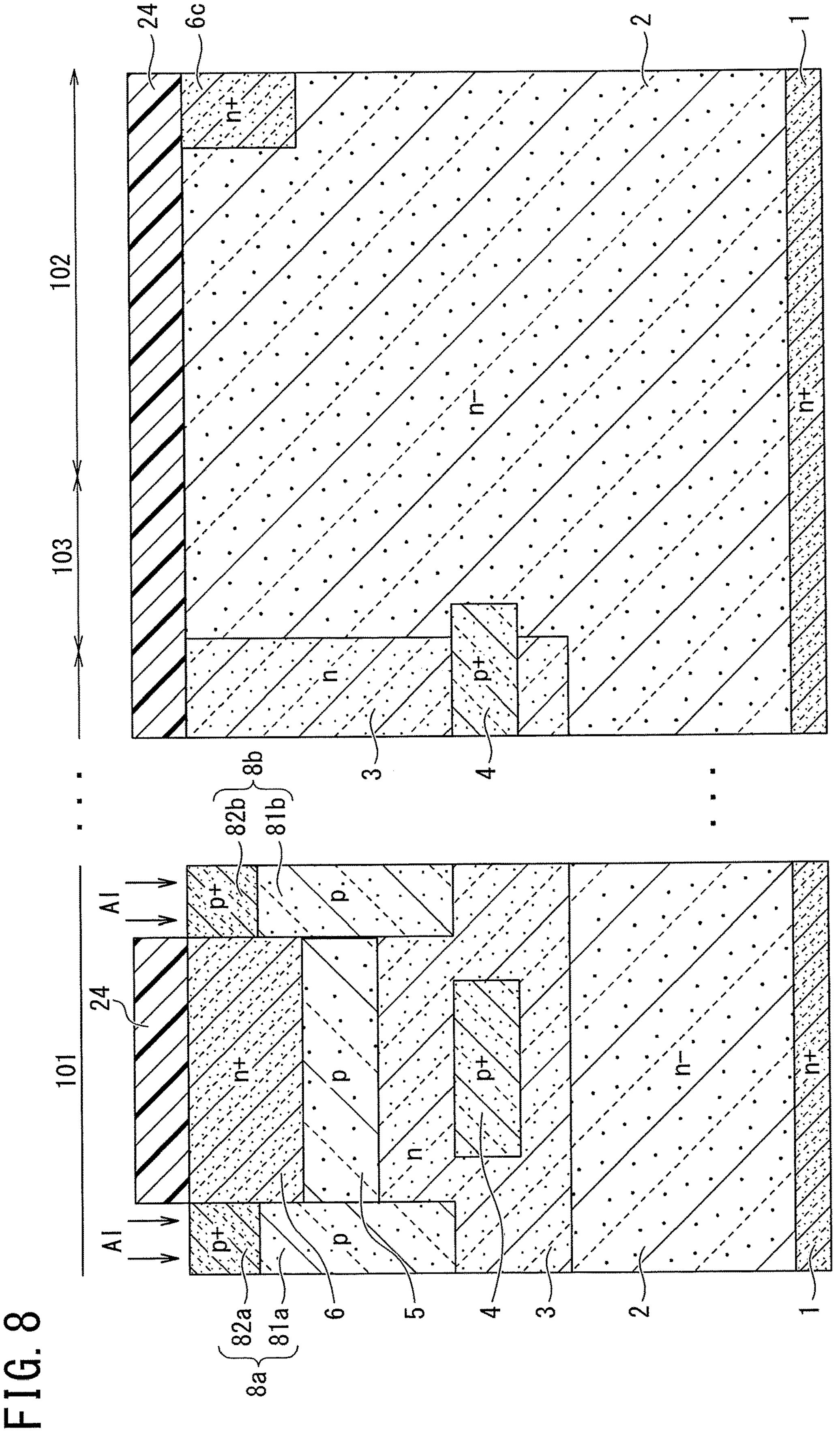
FIG. 8 is a cross-sectional schematic diagram following FIG. 7 for explaining the one example of the method for producing a SiC semiconductor device according to the first embodiment.

Next, a mask pattern 24 containing a photoresist film is formed on the upper surface of the current spreading layer 3 using a photolithography technology as illustrated in FIG. 8. Then, the buried regions 81*a*, 81*b* and the base contact regions 82*a*, 82*b* are formed using the mask pattern 24 as an ion implantation mask. The mask pattern 24 has openings at positions adjacent to the source region 6 in plan view in the active portion 101 and covers the breakdown voltage structure portion 102 and the region 103. Then, p-type impurities, such as aluminum (Al), are selectively ion-implanted using the mask pattern 24 as an ion implantation mask. More specifically, p-type impurities are implanted in multiple stages into regions 8*a*, 8*b* where the buried regions 81*a*, 81*b* and the base contact regions 82*a*, 82*b* are formed, respectively, along the depth direction. Thus, the buried regions 81*a*, 81*b* and the base contact regions 82*a*, 82*b* having an impurity concentration higher than that of the buried regions 81*a*, 81*b* are formed along the depth direction with the single mask pattern 24. As a result, the buried regions 81*a*, 81*b* are formed to be in contact with the base region 5 on the upper surface side of the current spreading layer 3 in the active portion 101. Then, the base contact regions 82*a*, 82*b* are formed to be in contact with the source region 6 on the upper surface sides of the buried region 81*a*, 81*b*, respectively.

In the ion implantation into the base contact regions 82*a*, 82*b*, the 4H-SiC structures on the upper surface sides of the base contact regions 82*a*, 82*b* are broken, forming amorphous structures. The temperature in the ion implantation is set low to break the 4H-SiC structures, and is set to about 20° C. or more and less than 300° C., for example. The dose amount in the ion implantation is set to be about $2\times10^{15}$ $cm^{-2}$ or more, for example. Thereafter, the mask pattern 24 is removed. The mask pattern 24 may be a hard mask pattern containing an oxide film, for example.

Figure 9:
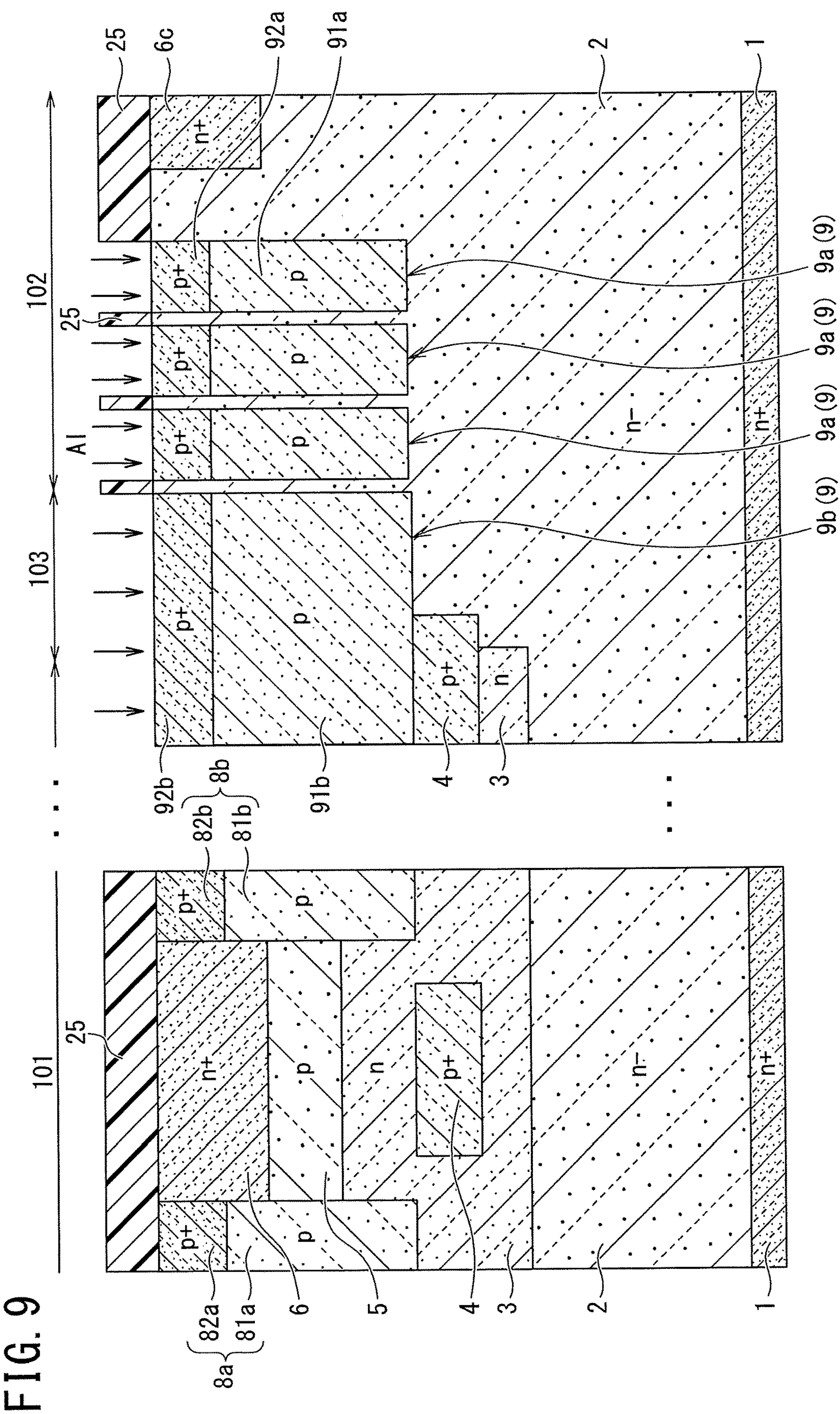
FIG. 9 is a cross-sectional schematic diagram following FIG. 8 for explaining the one example of the method for producing a SiC semiconductor device according to the first embodiment.

Next, the electric field relaxation regions 9*a* and the ring region 9*b* are simultaneously formed as illustrated in FIG. 9. More specifically, a mask pattern 25 containing a photoresist film is formed on the upper surface of the drift layer 2 using a photolithography technology. The mask pattern 25 has openings in the regions 9 where the electric field relaxation regions 9*a* and the ring region 9*b* are to be formed in plan view in the breakdown voltage structure portion 102 and the region 103, respectively, and covers the active portion 101. Then, p-type impurities, such as aluminum (Al), are selectively ion-implanted using the mask pattern 25 as an ion implantation mask. More specifically, p-type impurities are implanted into the regions 9 in multiple stages. This makes the impurity concentration of the second parts 92*a*, 92*b*, which are located at positions shallower in the depth direction than the positions of the first parts 91*a*, 91*b*, larger than that of the first parts 91*a*, 91*b*. As a result, the electric field relaxation regions 9*a* are formed on the upper surface side of the drift layer 2 in the breakdown voltage structure portion 102, and the ring region 9*b* is formed on the upper surface side of the current spreading layer 3 in the region 103.

The ion implantation into the regions 9 is performed such that the breakage of the 4H-SiC structures in the regions 9 is not excessively large. More specifically, when the temperature in the ion implantation is set low, the dose amount in the ion implantation is set small. More specifically, when the temperature in the ion implantation is set to about 20° C. or more and less than 300° C., for example, the dose amount in the ion implantation is set to about less than $2\times10^{15}$ $cm^{-2}$, which suppresses the breakage of the 4H-SiC structure from becoming excessively large. When the temperature in the ion implantation is set high, i.e., the temperature is set to about 300° C. or more, e.g., 500° C., for example, the breakage of the 4H-SiC structure can be suppressed even when the dose amount in the ion implantation is larger than the value above. Thereafter, the mask pattern 25 is removed. The mask pattern 25 may be a hard mask pattern containing an oxide film, for example.

Next, an activation annealing (heat treatment) step is performed. In this activation annealing step, the activation annealing is performed at a temperature of about 1600° C. or more and 1900° C. or less, for example, thereby simultaneously activating the p-type impurities or the n-type impurities ion-implanted into each of the gate bottom protection region 4, the base region 5, the source region 6, the buried regions 81*a*, 81*b*, the base contact regions 82*a*, 82*b*, the electric field relaxation regions 9*a*, the ring region 9*b*, and the like. At this time, the amorphous structure of at least a part of each of the source region 6 and the base contact regions 82*a*, 82*b* becomes 3C-SiC by recrystallization, forming the source region 6 and the base contact regions 82*a*, 82*b* containing 3C-SiC. The electric field relaxation regions 9*a* and the ring region 9*b* remain 4H-SiC even after recrystallization.

Herein, an example is illustrated in which the activation annealing is performed once after all the ion implantation steps, but the activation annealing may be performed several times individually after each ion implantation step is completed. The ion implantation steps in FIGS. 4 to 9 may also be performed in different orders. It may be acceptable that, before the activation annealing, a cap film containing carbon (C) is formed, the activation annealing is performed after the execution of the covering with the cap film, and the cap film is removed after the activation annealing.

Figure 10:
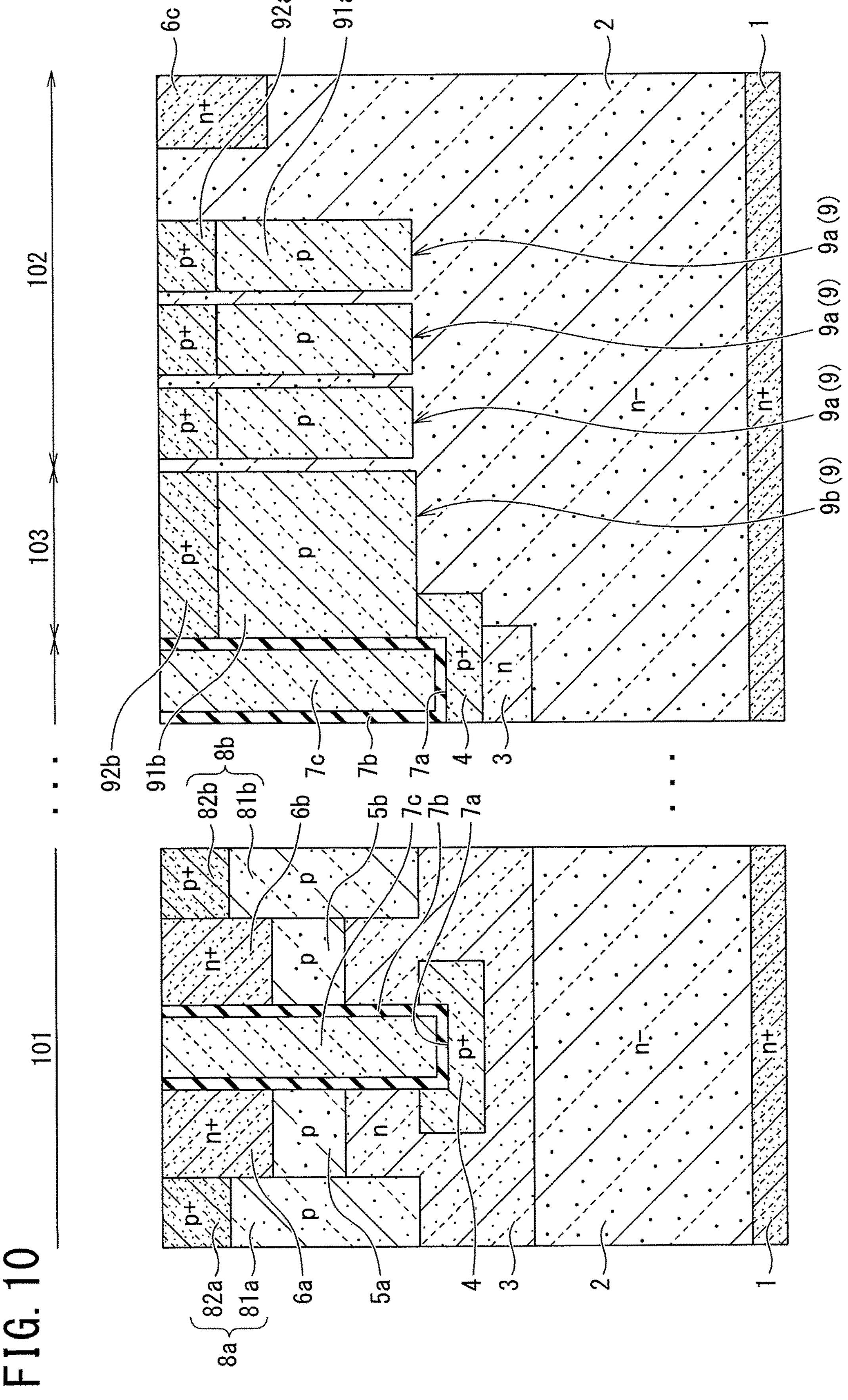
FIG. 10 is a cross-sectional schematic diagram following FIG. 9 for explaining the one example of the method for producing a SiC semiconductor device according to the first embodiment.

Next, a trench formation step is performed as illustrated in FIG. 10. In this trench formation step, a hard mask pattern containing an oxide film, for example, is formed on the upper surface of SiC using a photolithography technology, a dry etching technology, a CVD technology, and the like. The hard mask pattern has an opening at a position where the trench 7*a* is to be formed. Then, the trench 7*a* is selectively formed in the depth direction from the upper surface of the source region 6 by a dry etching technology, such as reactive ion etching (RIE), using the hard mask pattern as an etching mask. A photoresist film may be used in place of the hard mask pattern as the etching mask. The trench 7*a* passes through the source region 6 and the base region 5, and further digs through an upper portion of the current spreading layer 3 to reach the gate bottom protection region 4. The source region 6 is divided into the source regions 6*a*, 6*b*. The base region 5 is divided into the base regions 5*a*, 5*b*. Thereafter, the etching mask is removed.

Next, a gate insulating film/gate electrode formation step is performed. In the gate insulating film/gate electrode formation step, the gate insulating film 7*b* is formed on the lower surface and the side surfaces of the trench 7*a* by a CVD technology, a high temperature oxidation (HTO) method, a thermal oxidation method, or the like. Next, a polysilicon layer doped with impurities, such as phosphorus (P) or boron (B), with a high concentration (doped polysilicon layer) is deposited to fill the inside of the trench 7*a* by a CVD technology and the like. Thereafter, a part of the polysilicon layer and a part of the gate insulating film 7*b* are selectively removed by a photolithography technology and dry etching. This results in the formation of an insulated gate electrode structure (7*b*, 7*c*) containing the gate insulating film 7*b* and the gate electrode 7*c* as illustrated in FIG. 10.

Figure 11:
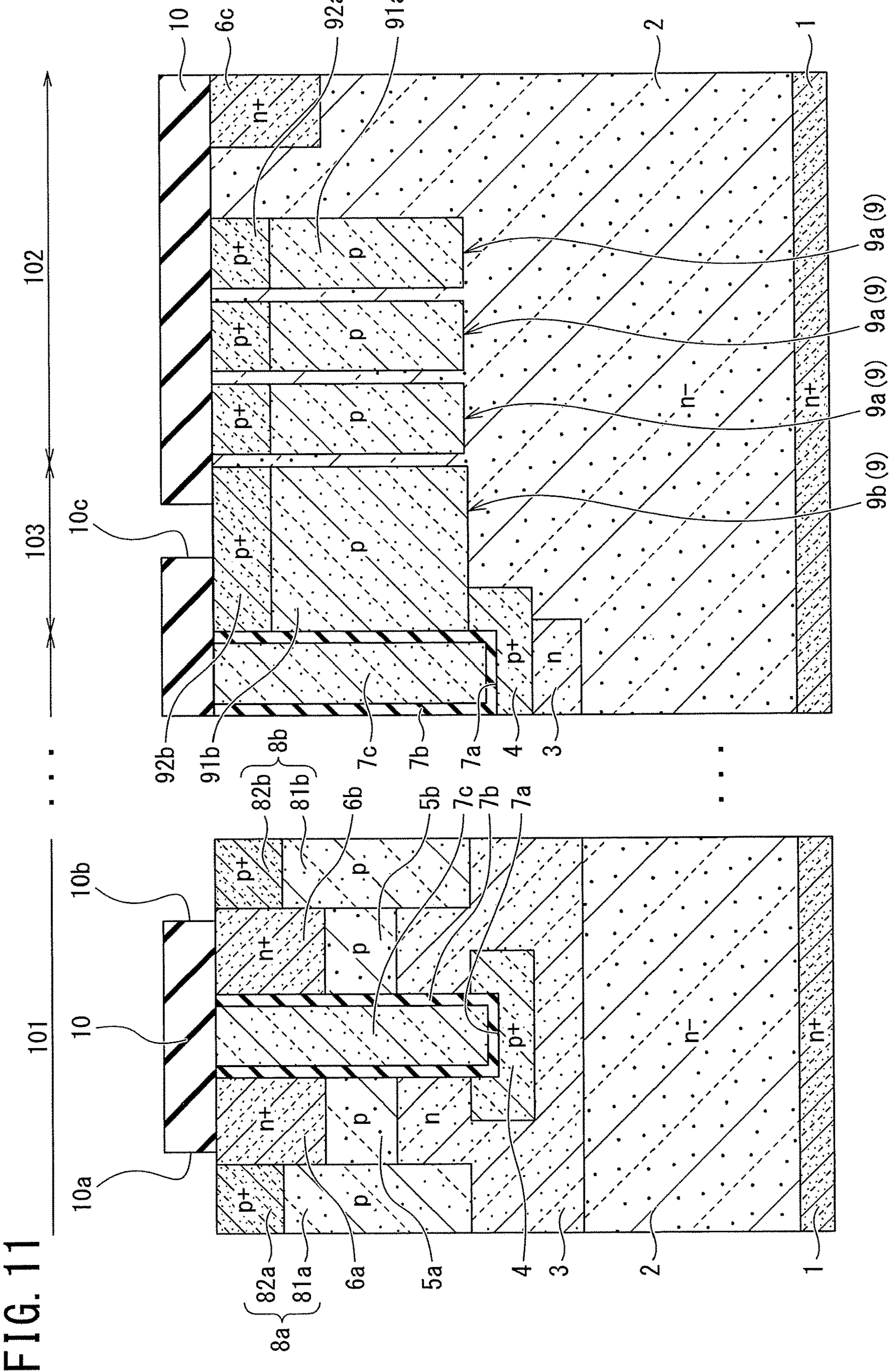
FIG. 11 is a cross-sectional schematic diagram following FIG. 10 for explaining the one example of the method for producing a SiC semiconductor device according to the first embodiment.

Next, the insulating film 10 is deposited on the upper surface of SiC by a CVD technology and the like as illustrated in FIG. 11. Then, a part of the insulating film 10 is selectively removed by a photolithography technology, a dry etching technology, and the like, opening the contact holes 10*a*, 10*b* exposing the upper surfaces of the source regions 6*a*, 6*b* and the base contact regions 82*a*, 82*b*, respectively, in the insulating film 10. Further, the contact hole 10*c* exposing the upper surface of the ring region 9*b* is opened. Thereafter, heat treatment (reflow) for flattening the insulating film 10 may be performed.

Next, the barrier metal layer 11 and the source wiring electrode 12 are sequentially formed to cover the upper surface and the side surfaces of the insulating film 10 and the upper surfaces of the source regions 6*a*, 6*b*, the base contact regions 82*a*, 82*b*, and the ring region 9*b* by a sputtering technology or a vapor deposition method, forming the source electrodes (11, 12) illustrated in FIG. 2. The barrier metal layer 11 is in contact with the source regions 6*a*, 6*b*, the base contact regions 82*a*, 82*b*, and the ring region 9*b*. The barrier metal layer 11 is in ohmic-contact with the source regions 6*a*, 6*b* and the base contact regions 82*a*, 82*b* with low resistance.

Next, the SiC substrate 1 is thinned from the lower surface side by grinding, chemical mechanical polishing (CMP), or the like, thereby adjusting the thickness, so that the SiC substrate 1 serves as the drain region 1. Next, the drain electrode 13 (see FIG. 2) containing gold (Au) or the like is formed on the entire lower surface of the drain region 1 by sputtering, a vapor deposition method, or the like. This completes the SiC semiconductor device illustrated in FIG. 2.

According to the method for producing a SiC semiconductor device of the first embodiment, the ion implantation for forming 3C-SiC and the ion implantation for forming 4H-SiC are formed in different steps. Therefore, even when at least a part of each of the source regions 6*a*, 6*b* and the base contact regions 82*a*, 82*b* is constituted of 3C-SiC, the electric field relaxation regions 9*a* can be constituted of 4H-SiC. More specifically, both the base contact regions 82*a*, 82*b* and the electric field relaxation regions 9*a* are formed by the ion implantation of second conductivity-type (p-type) impurities, but each ion implantation is performed with a different dose amount in each of separated steps. Therefore, even when at least a part of each of the base contact region 82*a*, 82*b* is constituted of 3C-SiC, the electric field relaxation regions 9*a* can be constituted of 4H-SiC having a band gap wider than that of 3C-SiC. This can suppress the lowering of the breakdown voltage performance of the breakdown voltage structure portion 102.

In each of the source regions 6*a*, 6*b* and the base contact regions 82*a*, 82*b*, at least a part in contact with the source electrodes (11, 12) contains 3C-SiC. Therefore, the source regions 6*a*, 6*b* and the base contact regions 82*a*, 82*b* can ohmic-contact the source electrodes (11, 12) with low resistance without forming the silicide layer of nickel (Ni) silicide or the like. Thus, problems, such as peeling of the silicide layer, can be suppressed as compared with a case where the silicide layer is formed.

In the production method described above, the ion implantation into the base contact regions 82*a*, 82*b* is performed, and then the ion implantation for forming the electric field relaxation regions 9*a* is performed. However, it may be acceptable that the ion implantation for forming the electric field relaxation regions 9*a* is first performed, and then the ion implantation into the base contact regions 82*a*, 82*b* is performed.

Second Embodiment

A SiC semiconductor device 100 according to a second embodiment is different in the configuration of the ring region 9*b* from the SiC semiconductor device 100 according to the first embodiment illustrated in FIG. 2. The ring region 9*b* according to the second embodiment contains 3C-SiC in at least part (upper surface side) in contact with the source electrodes (11, 12). More specifically, at least a part of the second part 92*b* contains the 3C-structure.

According to the SiC semiconductor device 100 of the second embodiment, the ring region 9*b* contains 3C-SiC, and therefore can ohmic-contact the barrier metal layer 11 of the source electrodes (11, 12) with low resistance.

<Method for Producing SiC Semiconductor Device>

Next, an example of a method for producing the SiC semiconductor device 100 according to the second embodiment will be described. The method for producing the SiC semiconductor device 100 according to the second embodiment is described only in terms of differences from the method for producing the SiC semiconductor device 100 according to the first embodiment.

Figure 12:
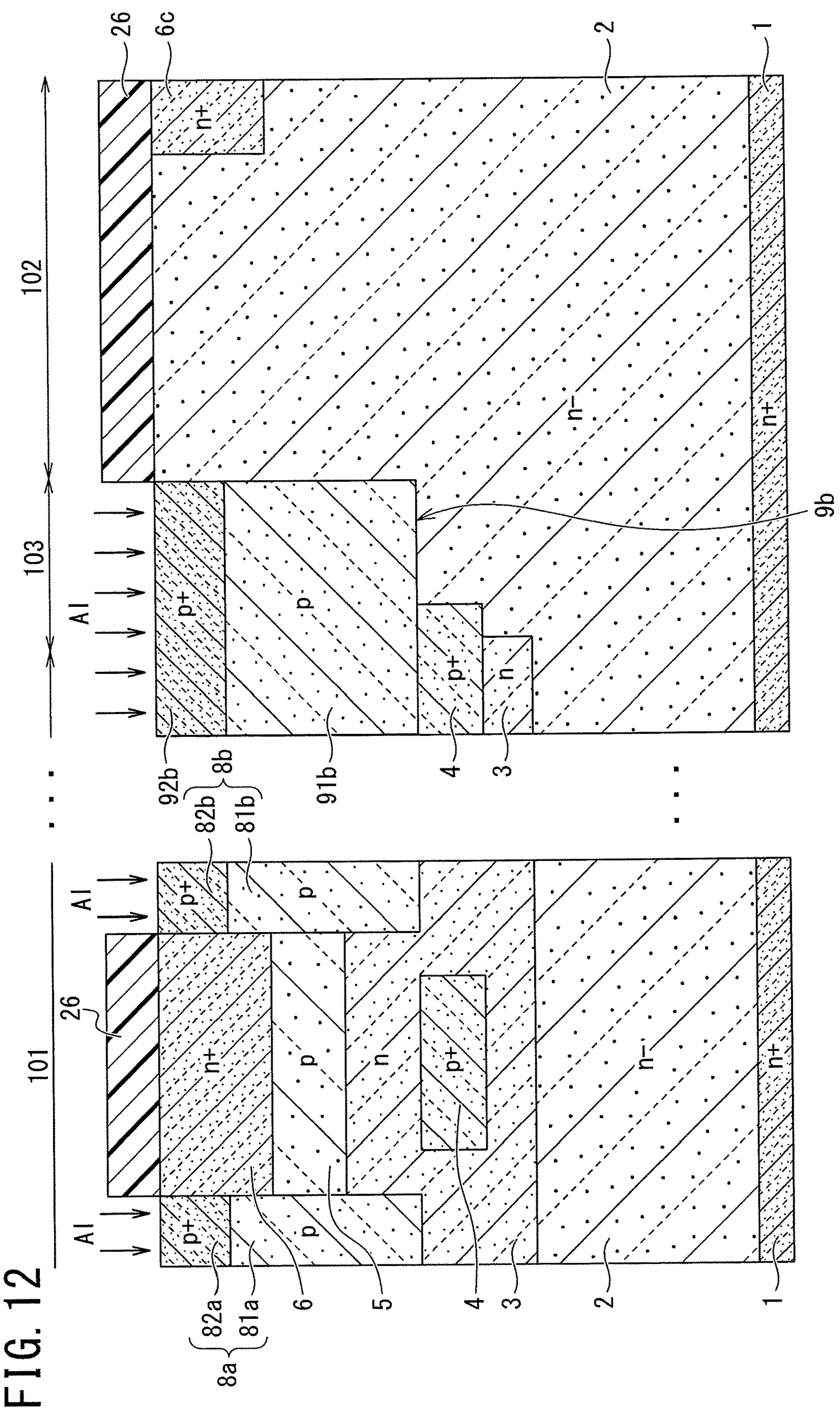
FIG. 12 is a cross-sectional schematic diagram for explaining one example of a method for producing a SiC semiconductor device according to a second embodiment.

As illustrated in FIG. 12, the ion implantation for forming the base contact regions 82*a*, 82*b* and the ion implantation for forming the ring region 9*b* are simultaneously performed. More specifically, a mask pattern 26 containing a photoresist film is formed on the upper surface of the current spreading layer 3 using a photolithography technology. The mask pattern 26 has openings at positions adjacent to the source region 6 in plan view in the active portion 101 and an opening at a position where the ring region 9*b* is to be formed in the region 103. The mask pattern 26 may be a hard mask pattern containing an oxide film, for example.

Then, p-type impurities, such as aluminum (Al), are selectively ion-implanted using the mask pattern 26 as an ion implantation mask. The conditions of the ion implantation are the same as the conditions of the ion implantation for forming the base contact regions 82*a*, 82*b* described in the first embodiment. More specifically, the temperature in the ion implantation is set low to break the 4H-SiC structure, and is set to about 20° C. or more and less than 300° C., for example. The dose amount in the ion implantation is set to be about $2\times10^{15}$ $cm^{-2}$ or more, for example. Thereafter, the mask pattern 26 is removed.

Figure 13:
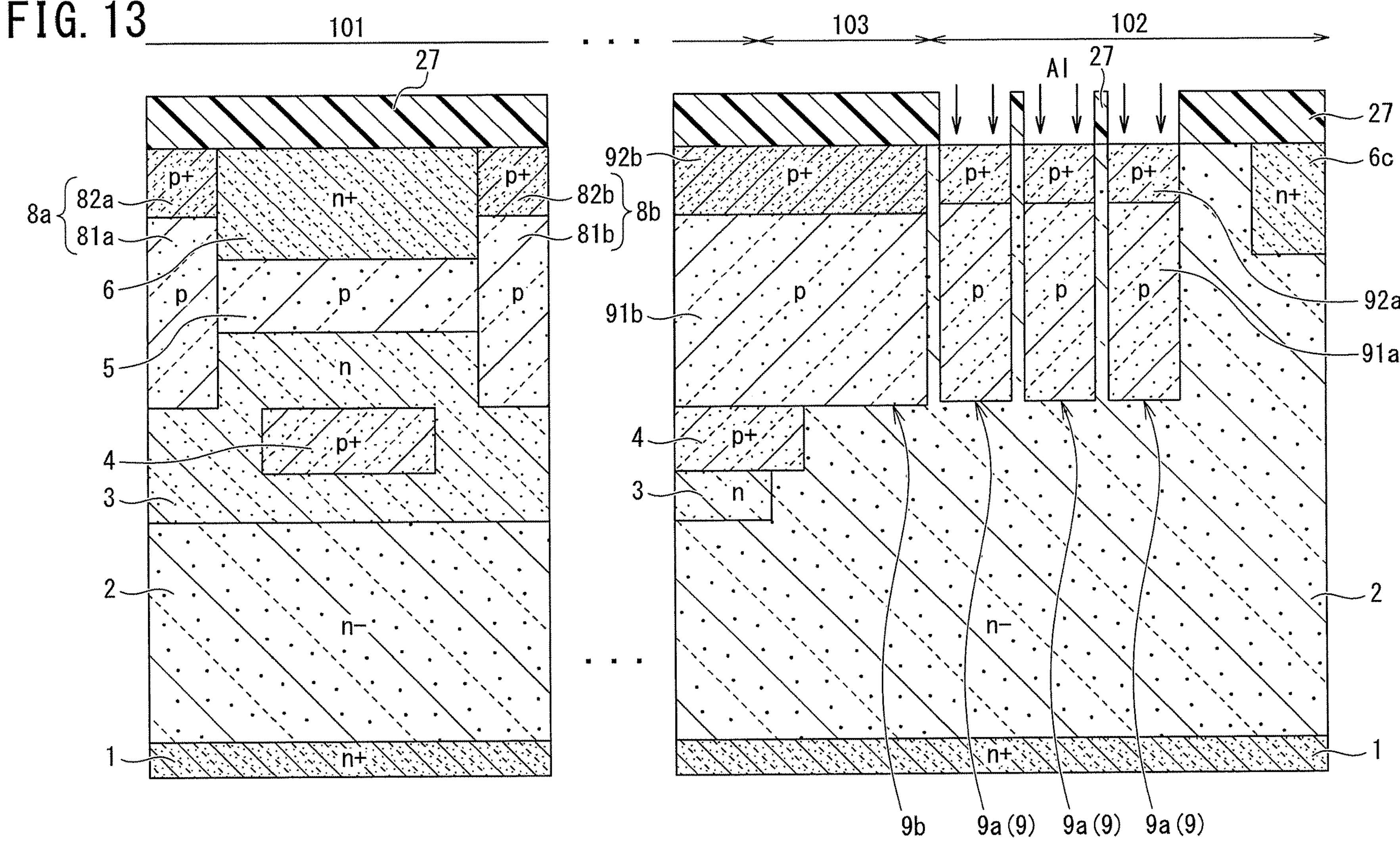
FIG. 13 is a cross-sectional schematic diagram for explaining the one example of the method for producing a SiC semiconductor device according to the second embodiment.

The ion implantation for forming the electric field relaxation regions 9*a* is described with reference to FIG. 13. First, a mask pattern 27 containing a photoresist film is formed on the upper surface of the drift layer 2 using a photolithography technology. The mask pattern 27 may be a hard mask pattern containing an oxide film, for example. The mask pattern 27 has openings at positions where the electric field relaxation regions 9*a* are to be formed in the breakdown voltage structure portion 102 and covers the active portion 101 and the region 103. Then, p-type impurities, such as aluminum (Al), are selectively ion-implanted using the mask pattern 27 as an ion implantation mask. The conditions of the ion implantation are the same as the conditions of the ion implantation for forming the electric field relaxation regions 9*a* described in the first embodiment. More specifically, when the temperature in the ion implantation is set to about 20° C. or more and less than 300° C., for example, the dose amount in the ion implantation is set to be about less than $2\times10^{15}$ $cm^{-2}$. When the temperature in the ion implantation is set high, i.e., the temperature is set to about 300° C. or more, e.g., 500° C., for example, the dose amount in the ion implantation may be set larger than the value above. Thereafter, the mask pattern 27 is removed.

Third Embodiment

A SiC semiconductor device 100 according to a third embodiment is different from the SiC semiconductor device 100 according to the first embodiment described above in that at least a part (upper surface side) which is in contact with the source electrodes (11, 12) of each of the source regions 6*a*, 6*b* and the base contact regions 82*a*, 82*b* illustrated in FIG. 2 contains an inert gas element.

In the third embodiment, the impurity concentration of each of the source regions 6*a*, 6*b* and the base contact regions 82*a*, 82*b* may be set lower than that of the SiC semiconductor device 100 according to the first embodiment. More specifically, the impurity concentration of each of the source regions 6*a*, 6*b* and the base contact regions 82*a*, 82*b* may be at least a concentration at which transistors can operate, and is in a range of about $2\times10^{19}$ $cm^{-3}$ or more and less than $1\times10^{20}$ $cm^{-3}$, for example. The inert gas element contained in the source regions 6*a*, 6*b* and the base contact regions 82*a*, 82*b* is helium (He) or argon (Ar), for example. The impurity concentration of the second parts 92*a* of the electric field relaxation regions 9*a* and the second part 92*b* of the ring region 9*b* is substantially the same as the impurity concentration of the base contact region 82*a*, 82*b*, and is in a range of about $2\times10^{18}$ $cm^{-3}$ or more and less than $1\times10^{20}$ $cm^{-3}$.

<Method for Producing SiC Semiconductor Device>

Next, an example of a method for producing the SiC semiconductor device 100 according to the third embodiment will be described. The method for producing a SiC semiconductor device 100 according to the third embodiment includes ion-implanting the inert gas element to break the 4H-SiC structure. The method for producing the SiC semiconductor device 100 according to the third embodiment is described only in terms of differences from the method for producing the SiC semiconductor device 100 according to the first embodiment. The description is given using figures used to describe the production method of the first embodiment as appropriate.

In a step of forming the source region 6 illustrated in FIG. 6, ion implantation is performed such that the breakage of the 4H-SiC structure is not excessively large in the third embodiment. More specifically, when the temperature in the ion implantation is set to about 20° C. or more and less than 300° C., for example, the dose amount in the ion implantation is set to be about less than $2\times10^{15}$ $cm^{-2}$.

Figure 14:
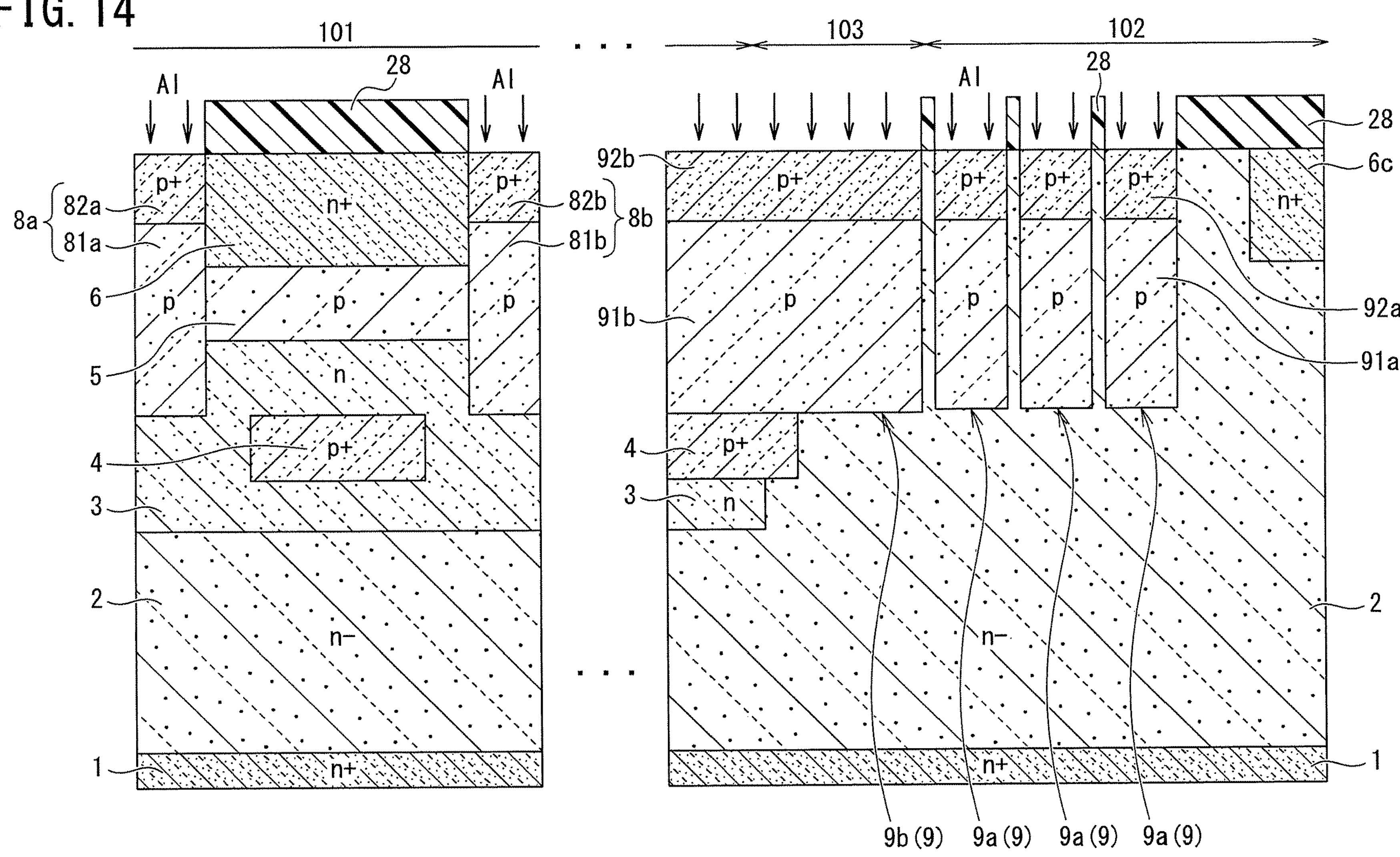
FIG. 14 is a cross-sectional schematic diagram for explaining one example of a method for producing a SiC semiconductor device according to a third embodiment.

As illustrated in FIG. 14, in the third embodiment, ion implantation of a step of forming the buried regions 81*a*, 81*b* and the base contact regions 82*a*, 82*b* and ion implantation of a step of forming the electric field relaxation regions 9*a* and the ring region 9*b* are simultaneously performed. First, a mask pattern 28 containing a photoresist film is formed on the upper surface of the current spreading layer 3 using a photolithography technology. The mask pattern 28 may be a hard mask pattern containing an oxide film, for example. The mask pattern 28 has openings at positions where the base contact regions 82*a*, 82*b* are to be formed in the active portion 101, openings at positions where the electric field relaxation regions 9*a* are to be formed in the breakdown voltage structure portion 102, and an opening at a position where the ring region 9*b* is to be formed in the region 103. Then, p-type impurities, such as aluminum (Al), are selectively ion-implanted using the mask pattern 28 as an ion implantation mask. The ion implantation is performed such that the breakage of the 4H-SiC structure is not excessively large. More specifically, when the temperature in the ion implantation is set to about 20° C. or more and less than 300° C., for example, the dose amount in the ion implantation may be set to be about less than $2\times10^{15}$ $cm^{-2}$. Thereafter, the mask pattern 28 is removed.

Figure 15:
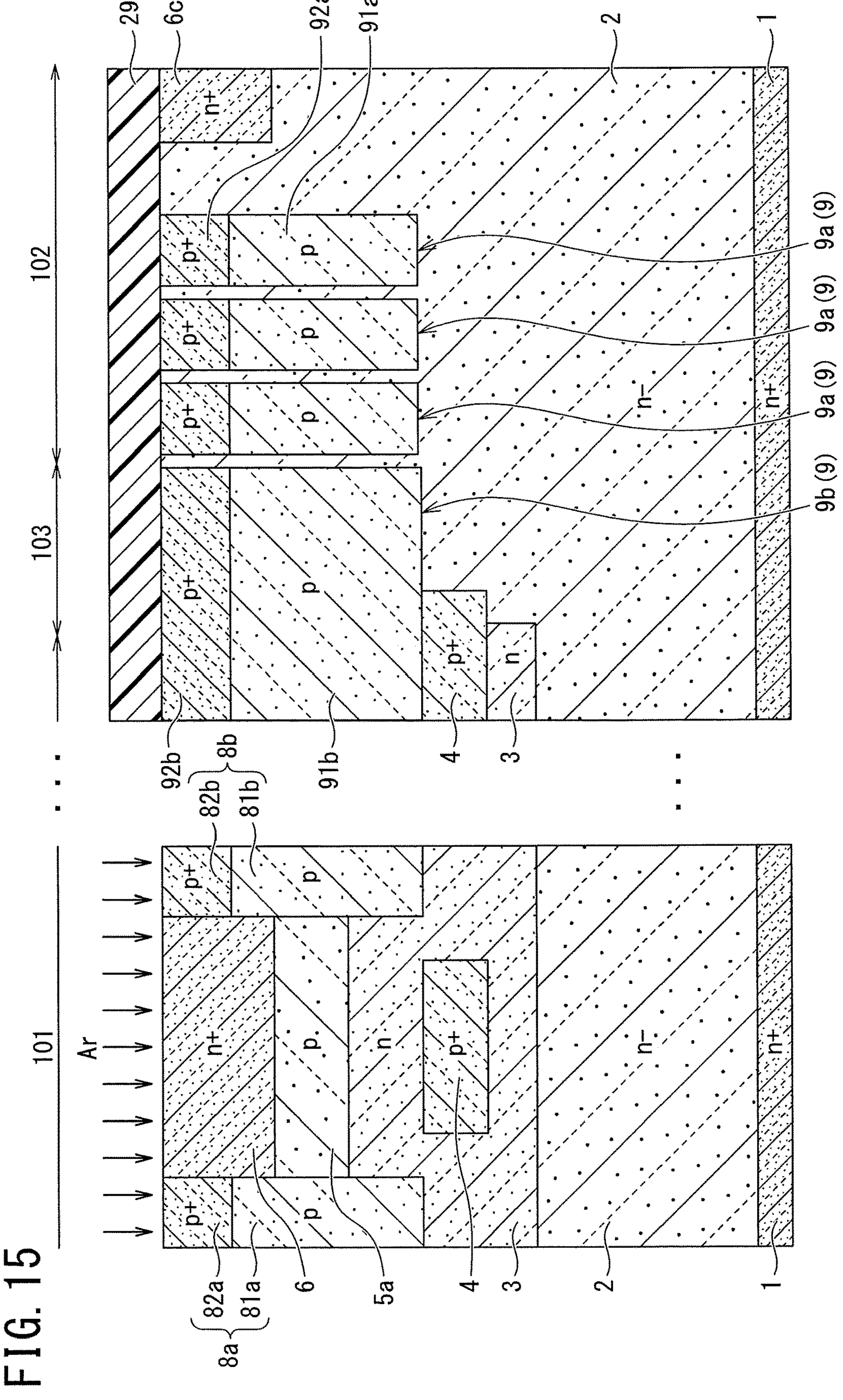
FIG. 15 is a cross-sectional schematic diagram for explaining the one example of the method for producing a SiC semiconductor device according to the third embodiment.

The step of ion-implanting the inert gas element into the source region 6 and the base contact regions 82*a*, 82*b* is described with reference to FIG. 15. First, a mask pattern 29 containing a photoresist film is formed on the upper surface of the drift layer 2 using a photolithography technology. The mask pattern 29 may be a hard mask pattern containing an oxide film, for example. The mask pattern 29 has openings at positions where the source region 6 and the base contact regions 82*a*, 82*b* are located in the active portion 101 and covers the breakdown voltage structure portion 102 and the region 103. Then, the inert gas element is selectively ion-implanted using the mask pattern 29 as an ion implantation mask. More specifically, the inert gas element is ion-implanted into the source region 6 and the base contact regions 82*a*, 82*b* with a dose amount of about $2\times10^{15}$ $cm^{-2}$ or more in total with the dose amount of first conductivity-type impurities or with the dose amount of second conductivity-type impurities. At that time, the temperature in the ion implantation is set to about 20° C. or more and less than 300° C., for example. The inert gas element is, for example, helium (He) or argon (Ar). FIG. 15 illustrates an example of ion-implanting an argon element. Thereafter, the mask pattern 29 is removed. This breaks the 4H-SiC structure in the active portion 101, and the subsequent activation annealing can form a 3C-SiC region in the active portion 101.

The dose amount of the inert gas element may be about $2\times10^{15}$ $cm^{-2}$ or more, with which the 4H-SiC structure can be broken with only the dose of the inert gas element.

The ion implantation into the source region 6, the base contact regions 82*a*, 82*b*, the electric field relaxation regions 9*a*, and the ring region 9*b* is performed at a temperature of about 20° C. or more and less than 300° C., but may be performed at a higher temperature of about 300° C. or more, e.g., 500° C., for example. In that case, the dose amount of the impurities may have a value larger than the value described above. Then, the dose amount of the inert gas element may be set to $2\times10^{15}$ $cm^{-2}$ or more.

In the description of the production method described above, the ion implantation of the inert gas element is performed after the ion implantation of the impurities, but may be performed before the ion implantation of the impurities.

Hereinafter, Example 1, which is an example of the first embodiment, and Example 2, which is an example of the third embodiment, are described.

Example 1

Region/Dose amount
Source region 6/$2\times10^{15}$ $cm^{-2}$
Base contact regions 82*a*, 82*b*/$2\times10^{15}$ $cm^{-2}$
Electric field relaxation regions 9*a*/$2\times10^{14}$ $cm^{-2}$ When the ion implantation was performed under the conditions described above, the total dose amount is $4.2\times10^{15}$ $cm^{-2}$.

Example 2

Region/Dose amount

Source region 6/$2\times10^{14}$ $cm^{-2}$

Base contact regions 82*a*, 82*b*/$2\times10^{14}$ $cm^{-2}$

Electric field relaxation regions 9*a*/$2\times10^{15}$ $cm^{-2}$

When the ion implantation was performed under the conditions described above, the total dose amount is $2.4\times10^{15}$ $cm^{-2}$, which is smaller than that in Example 1. The smaller the total dose amount, the less time it takes for the ion implantation.

According to the method for producing the SiC semiconductor device 100 of the third embodiment, 4H-SiC of each of the source region 6 and the base contact regions 82*a*, 82*b* can be broken at once by the ion implantation of the inert gas element, and therefore the implantation amount of the impurities can be reduced to the extent that transistors may operate. This can reduce the total dose amount and can shorten the time required for the ion implantation as compared with the time in the case of the first embodiment.

Other Embodiments

Although the first to third embodiments of this disclosure are described above, the discussion and the drawings forming part of this disclosure should not be understood as limiting this disclosure. Various alternative embodiments, examples, and operational technologies will be apparent to those skilled in the art from this disclosure.

For example, the MOSFET is illustrated as the semiconductor devices according to the first to third embodiments, but this disclosure is also applicable to an insulated-gate bipolar transistor (IGBT) having a configuration in which a $p^+$-type collector region is provided in place of the $n^+$-type drain region 1. Further, in addition to the IGBT alone, this disclosure is also applicable to a reverse conducting IGBT (RC-IGBT) or a reverse blocking insulated-gate bipolar transistor (RB-IGBT).

The first to third embodiments describe the case where the electric field relaxation regions 9*a* are the guard rings, but a JTE structure may be acceptable.

The configurations disclosed by the first to third embodiments may be combined as appropriate to the extent that no contradictions arise. Thus, it is a matter of course that this disclosure includes various embodiments and the like not described herein. Therefore, the technical scope of this disclosure is defined only by the matter specifying the invention according to claims reasonable from the description above.

The invention claimed is:

1. A silicon carbide semiconductor device comprising:

an active portion; and a breakdown voltage structure portion provided surrounding a periphery of the active portion in plan view, wherein a first conductivity-type drift layer containing silicon carbide is provided over the active portion and the breakdown voltage structure portion, the active portion has:

a second conductivity-type base region containing silicon carbide provided on an upper surface side of the drift layer;

a first conductivity-type main region containing silicon carbide provided on an upper surface side of the base region;

a second conductivity-type buried region containing silicon carbide provided in contact with the base region on the upper surface side of the drift layer;

a second conductivity-type base contact region containing silicon carbide provided in contact with the main region on an upper surface side of the buried region;

a gate electrode provided with a gate insulating film interposed inside a trench passing through the main region and the base region; and a main electrode provided in contact with the main region and the base contact region, the breakdown voltage structure portion has:

a second conductivity-type electric field relaxation region containing silicon carbide provided on the upper surface side of the drift layer; and an insulating film provided on an upper surface of the electric field relaxation region, the main region and the base contact region each contain a 3C-structure in at least a part in contact with the main electrode, and the electric field relaxation region is composed of a 4H-structure.

2. The silicon carbide semiconductor device according to claim 1, wherein the buried region contains a 4H-structure.

3. The silicon carbide semiconductor device according to claim 1, wherein at least a part in contact with the main electrode of each of the main region and the base contact region contains an inert gas element.

4. The silicon carbide semiconductor device according to claim 3, wherein the inert gas element is helium or argon.

5. The silicon carbide semiconductor device according to claim 1, wherein a plurality of the electric field relaxation regions is a plurality of guard rings provided in the breakdown voltage structure portion.

6. The silicon carbide semiconductor device according to claim 1, comprising:

a second conductivity-type ring region containing silicon carbide provided surrounding the active portion on the upper surface side of the drift layer between the active portion and the breakdown voltage structure portion in plan view, wherein the ring region has an upper surface in contact with the main electrode and contains a 3C-structure in at least a part in contact the main electrode.

7. The silicon carbide semiconductor device according to claim 1, wherein a dimension in a depth direction of each of the main region and the base contact region is 0.5 μm or less.

8. The silicon carbide semiconductor device according to claim 1, wherein each of the main region and the base contact region contains a 3C-structure and a 4H-structure.

9. The silicon carbide semiconductor device according to claim 8, wherein a proportion of the 3C-structure contained in a part from an upper surface to a depth of 0.3 μm of each of the main region and the base contact region is in a range of 50% or more and 100% or less.

10. The silicon carbide semiconductor device according to claim 1, wherein each of the main region and the base contact region has an impurity concentration in a range of $1\times10^{19}$ $cm^{-3}$ or more and $3\times10^{21}$ $cm^{-3}$ or less.

11. The silicon carbide semiconductor device according to claim 1, wherein the electric field relaxation region has an impurity concentration of $2\times10^{18}$ $cm^{-3}$ or more in a part in contact with the insulating film.

12. A method for producing a silicon carbide semiconductor device comprising:

forming a first conductivity-type drift layer containing silicon carbide over an active portion and a breakdown voltage structure portion surrounding a periphery of the active portion in plan view;

forming a second conductivity-type base region containing silicon carbide on an upper surface side of the drift layer in the active portion;

forming a first conductivity-type main region on an upper surface side of the base region, the main region containing silicon carbide and containing a 3C-structure in at least an upper surface side part;

forming a second conductivity-type buried region containing silicon carbide to be in contact with the base region on the upper surface side of the drift layer;

forming a second conductivity-type base contact region to be in contact with the main region on an upper surface side of the buried region, the base contact region containing silicon carbide and containing a 3C-structure in at least an upper surface side part;

forming a trench passing through the main region and the base region;

forming a gate electrode with a gate insulating film interposed inside the trench;

forming a main electrode to be in contact with upper surfaces of the main region and the base contact region;

forming a second conductivity-type electric field relaxation region composed of 4H-structure silicon carbide on the upper surface side of the drift layer in the breakdown voltage structure portion; and forming an insulating film on an upper surface of the electric field relaxation region.

13. The method for producing a silicon carbide semiconductor device according to claim 12, wherein the forming the main region includes ion-implanting a first conductivity-type impurity with a dose amount of $2\times10^{15}$ $cm^{-2}$ or more, the forming the base contact region includes ion-implanting a second conductivity-type impurity with a dose amount of $2\times10^{15}$ $cm^{-2}$ or more, and the forming the electric field relaxation region includes ion-implanting a second conductivity-type impurity with a dose amount less than $2\times10^{15}$ $cm^{-2}$.

14. The method for producing a silicon carbide semiconductor device according to claim 12, the forming the main region including ion-implanting a first conductivity-type impurity with a dose amount less than $2\times10^{15}$ $cm^{-2}$, and the forming the base contact region and the forming the electric field relaxation region including simultaneously ion-implanting a second conductivity-type impurity with a dose amount less than $2\times10^{15}$ $cm^{-2}$, the method further comprising:

ion-implanting an inert gas element with a dose amount of $2\times10^{15}$ $cm^{-2}$ or more in total with the dose amount of the first conductivity-type impurity or with the dose amount of the second conductivity-type impurity into the main region and the base contact region.

15. The method for producing a silicon carbide semiconductor device according to claim 14, wherein the inert gas element is helium or argon.

16. The method for producing a silicon carbide semiconductor device according to claim 12, wherein the first conductivity-type impurity is phosphorus or nitrogen.

17. The method for producing a silicon carbide semiconductor device according to claim 12, wherein the second conductivity-type impurity is aluminum.

* * * * *